(12) United States Patent
Yazaki et al.

(10) Patent No.: US 11,032,904 B2
(45) Date of Patent: Jun. 8, 2021

(54) INTERPOSER SUBSTRATE AND CIRCUIT MODULE

(71) Applicant: Murata Manufacturing Co., Ltd., Nagaokakyo (JP)

(72) Inventors: Hirokazu Yazaki, Nagaokakyo (JP); Keito Yonemori, Nagaokakyo (JP); Takanori Tsuchiya, Nagaokakyo (JP); Koji Kamada, Nagaokakyo (JP); Takashi Noma, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 57 days.

(21) Appl. No.: 16/438,519

(22) Filed: Jun. 12, 2019

(65) Prior Publication Data

US 2019/0297726 A1  Sep. 26, 2019

Related U.S. Application Data

(63) Continuation of application No. PCT/JP2017/042938, filed on Nov. 30, 2017.

(30) Foreign Application Priority Data

Dec. 28, 2016 (JP) .............................. JP2016-254640

(51) Int. Cl.
*H05K 1/00* (2006.01)
*H05K 1/18* (2006.01)
(Continued)

(52) U.S. Cl.
CPC .............. *H05K 1/11* (2013.01); *H01R 12/62* (2013.01); *H05K 1/02* (2013.01); *H05K 1/0224* (2013.01);
(Continued)

(58) Field of Classification Search
CPC ... H05K 1/11; H05K 1/14; H05K 3/36; H05K 1/02; H05K 1/0224; H05K 1/141;
(Continued)

(56) References Cited

U.S. PATENT DOCUMENTS

| | | | |
|---|---|---|---|
| 6,207,550 B1* | 3/2001 | Hase ................... | H05K 3/4007 438/613 |
| 2005/0168961 A1* | 8/2005 | Ono ...................... | H05K 1/144 361/784 |

(Continued)

FOREIGN PATENT DOCUMENTS

| | | |
|---|---|---|
| JP | 11-26631 A | 1/1999 |
| JP | 11-177239 A | 7/1999 |

(Continued)

OTHER PUBLICATIONS

Official Communication issued in Japanese Patent Application No. 2018-558925, dated Nov. 26, 2019.
(Continued)

*Primary Examiner* — Yuriy Semenenko
(74) *Attorney, Agent, or Firm* — Keating & Bennett, LLP

(57) ABSTRACT

An interposer substrate includes a body, first to third external connection conductors, and a wiring conductor. The body includes first to third principal surfaces. A distance between the first and second principal surfaces is different from a distance between the first and third principal surfaces. The first external connection conductor is provided on the first principal surface and is connected to an external circuit board. The second external connection conductor is provided on the second principal surface and is connected to a first flat cable. The third external connection conductor is provided on the third principal surface and is connected to a second flat cable. The wiring conductor is provided in the
(Continued)

body, and connects the first external connection conductor and second and third external connection conductors.

5 Claims, 24 Drawing Sheets

(51) Int. Cl.
    *H05K 7/00* (2006.01)
    *H05K 1/11* (2006.01)
    *H01R 12/62* (2011.01)
    *H05K 1/02* (2006.01)
    *H05K 1/14* (2006.01)
    *H05K 3/46* (2006.01)
    *H05K 3/36* (2006.01)
(52) U.S. Cl.
    CPC ............... *H05K 1/14* (2013.01); *H05K 1/141* (2013.01); *H05K 1/181* (2013.01); *H05K 3/36* (2013.01); *H05K 3/46* (2013.01)
(58) Field of Classification Search
    CPC ........ H05K 1/181; H05K 3/46; H05K 3/4629; H05K 2201/10378; H01R 12/62; H01R 12/732
    See application file for complete search history.

(56) References Cited

U.S. PATENT DOCUMENTS

| 2014/0003007 | A1 | 1/2014 | Shiroki et al. |
| 2014/0218883 | A1 | 8/2014 | Dakhiya et al. |
| 2015/0082629 | A1* | 3/2015 | Kato ...................... H05K 1/148 29/860 |
| 2015/0131248 | A1* | 5/2015 | Dakhiya .............. H05K 3/4697 361/761 |

FOREIGN PATENT DOCUMENTS

| JP | 11-317490 A | 11/1999 |
| JP | 2005-251889 A | 9/2005 |
| JP | 2006-245193 A | 9/2006 |
| JP | 2006245193 | * 9/2006 |
| JP | 2008-258553 A | 10/2008 |
| JP | 2015-516693 A | 6/2015 |
| JP | 5842850 B2 | 1/2016 |

OTHER PUBLICATIONS

Official Communication issued in International Patent Application No. PCT/JP2017/042938 dated Mar. 6, 2018.

* cited by examiner

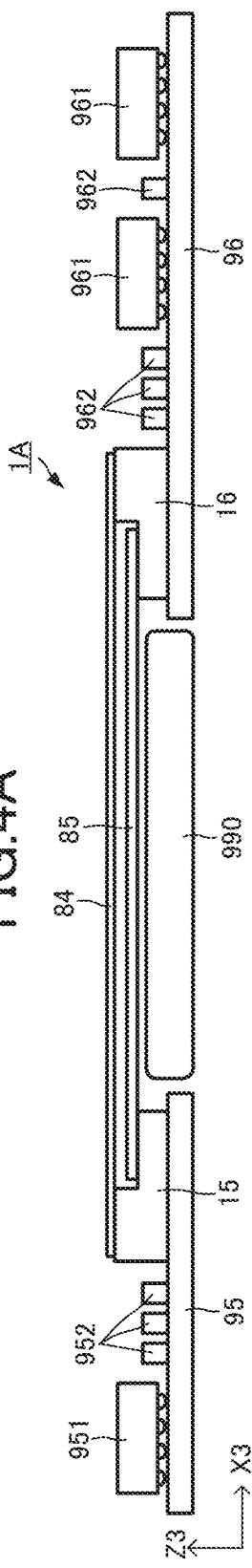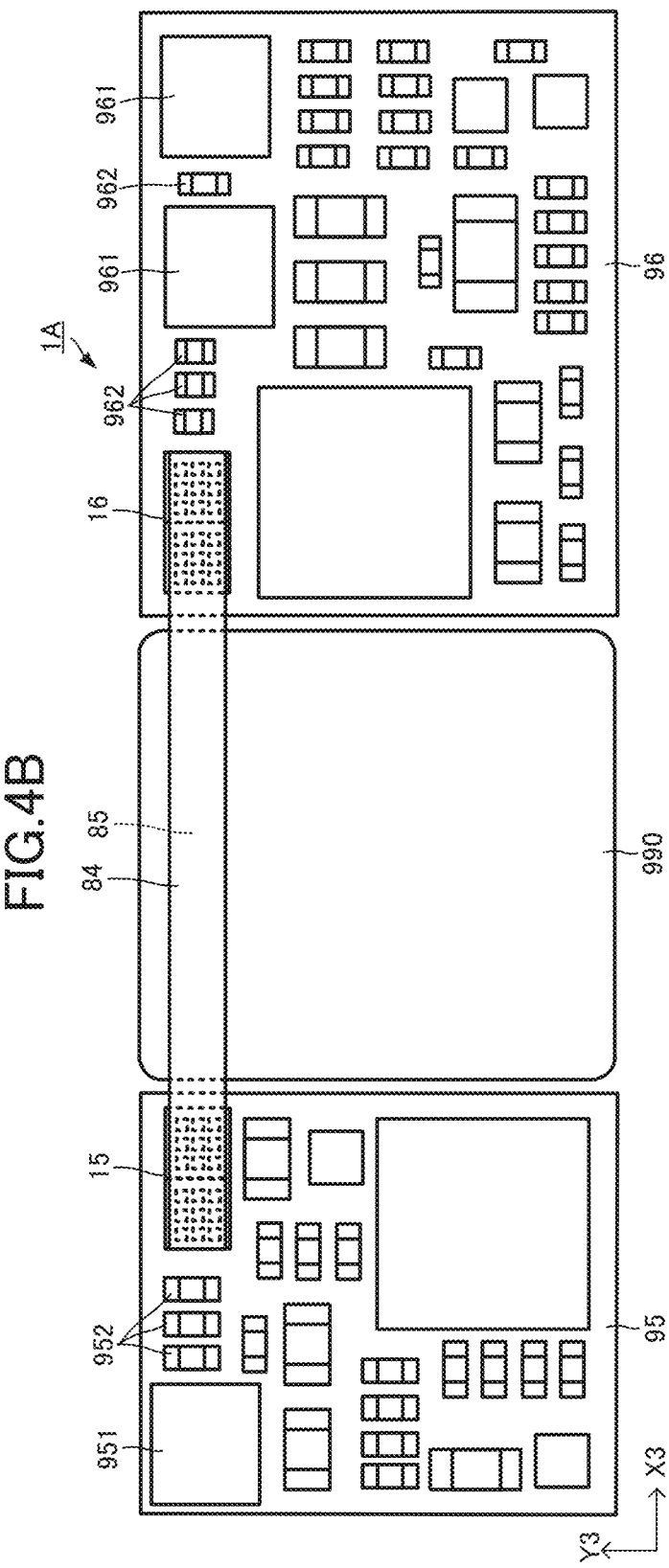

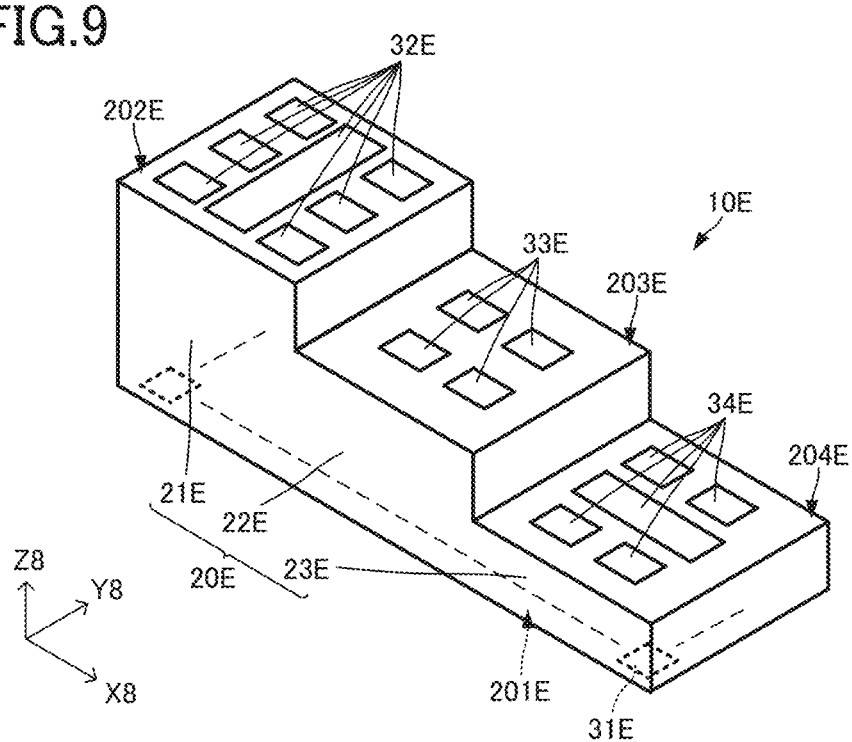

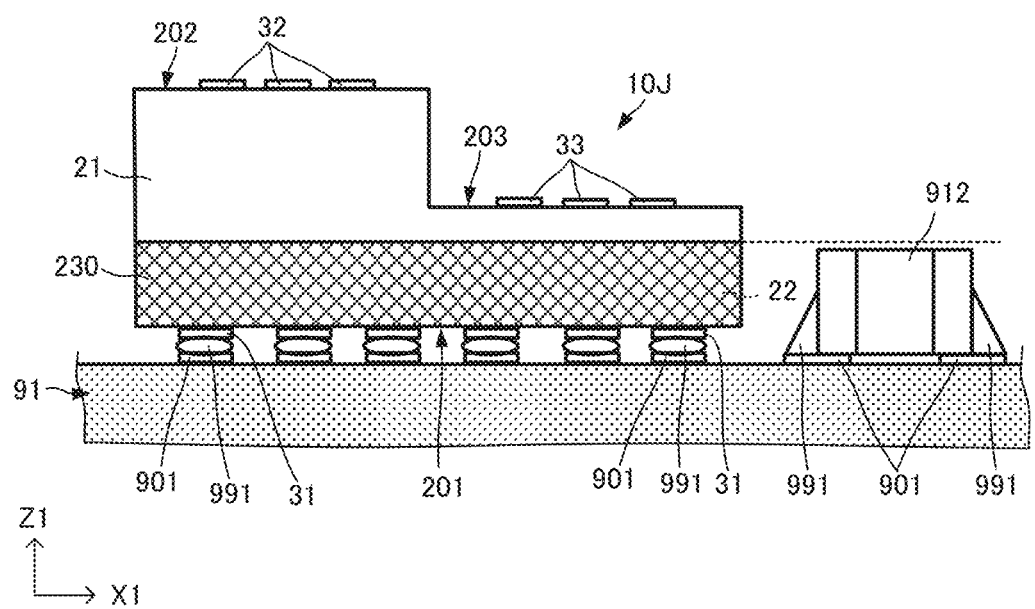

INTERPOSER SUBSTRATE AND CIRCUIT MODULE

CROSS REFERENCE TO RELATED APPLICATIONS

This application claims the benefit of priority to Japanese Patent Application No. 2016-254640 filed on Dec. 28, 2016 and is a Continuation Application of PCT Application No. PCT/JP2017/042938 filed on Nov. 30, 2017. The entire contents of each application are hereby incorporated herein by reference.

BACKGROUND OF THE INVENTION

1. Field of the Invention

The present invention relates to an interposer substrate used when connecting a circuit board and other circuit elements, and a circuit module including the interposer substrate.

2. Description of the Related Art

As shown in Japanese Patent No. 5842850, in a portable communication terminal and the like, a plurality of circuit boards are disposed in a housing. In order to connect the plurality of circuit boards, a flat cable as an example of other circuit elements may be used.

In the flat cable disclosed in Japanese Patent No. 5842850, a connector member is provided as an external terminal. The connector member of the flat cable is engaged with the connector member mounted on the circuit board, so that the flat cable is connected to the circuit board.

However, in a case in which the above-described connection structure is used, the number of connector members increases according to the number of flat cables, and the number of connector members on the side of the circuit board also increases corresponding to such an increase.

As a result, mounting space for the flat cable on the circuit board increases and, when the number of flat cables increases, problems such that flexibility in design of a circuit board is restricted may occur.

SUMMARY OF THE INVENTION

Preferred embodiments of the present invention provide connection structures capable of effectively utilizing a mounting surface of a circuit board even when the number of cables increases.

An interposer substrate according to a preferred embodiment of the present invention includes a body, a first external connection conductor, a second external connection conductor, a third external connection conductor, and a wiring conductor. The body includes a first principal surface, a second principal surface, and a third principal surface each of which is perpendicular or substantially perpendicular to a height direction of the body. A distance between the first principal surface and the second principal surface is different from a distance between the first principal surface and the third principal surface in the height direction.

The first external connection conductor is provided on the first principal surface and is a terminal conductor configured to mount the interposer substrate to an external circuit board. The second external connection conductor is provided on the second principal surface and is a terminal conductor to connect the interposer substrate to an external portion. The third external connection conductor is provided on the third principal surface and is a terminal conductor to connect the interposer substrate to an external portion. The wiring conductor includes a flat conductor pattern that has a flat plane perpendicular or substantially perpendicular to the height direction of the body, and a via conductor that extends in the height direction, and is provided in the body and connects the first external connection conductor, and the second external connection conductor and the third external connection conductor. The first external connection conductor is connected to the second external connection conductor and the third external connection conductor through the flat conductor pattern and the via conductor in the body, and includes a portion that is disposed outside the second external connection conductor and the third external connection conductor in a plan view.

In this configuration, a plurality of circuit elements, for example, a plurality of cables, are connected to a circuit board by one interposer substrate.

In an interposer substrate according to a preferred embodiment of the present invention, the distance between the first principal surface and the second principal surface may preferably be larger than the distance between the first principal surface and the third principal surface, and the distance between the first principal surface and the third principal surface may preferably be larger than a height of a surface mount electronic component that is mounted on the circuit board and is adjacent to the interposer substrate.

With this configuration, the contact of a circuit element (a cable, for example) disposed adjacent to the circuit board with a surface mount electronic component is able to be significantly reduced or prevented.

In an interposer substrate according to a preferred embodiment of the present invention, the body may preferably be a multilayer ceramic substrate including a plurality of ceramic layers stacked on each other.

With this configuration, the flatness of the body is increased and the shape of the interposer substrate is obtained with high precision.

In an interposer substrate according to a preferred embodiment of the present invention, the number of second external connection conductors may preferably correspond to the number of external circuit elements to be connected to the second external connection conductor.

In this configuration, a plurality of circuit elements (cables, for example) are connected to the circuit board by one interposer substrate.

In an interposer substrate according to a preferred embodiment of the present invention, the number of third external connection conductors may preferably correspond to the number of external circuit elements to be connected to the third external connection conductor.

In this configuration, a plurality of circuit elements (cables, for example) are connected to the circuit board by one interposer substrate.

In an interposer substrate according to a preferred embodiment of the present invention, the third principal surface, in a plan view in the height direction of the body, may preferably at least partially overlap with the second principal surface.

In this configuration, the plane area of the interposer substrate is reduced.

In an interposer substrate according to a preferred embodiment of the present invention, the body may preferably include a concave portion, and the third principal surface may preferably be defined by a wall of the concave portion that is concave from a lateral side of the body.

With this configuration, since the third principal surface overlaps with the second principal surface, the plane area of an interposer substrate is able to be further reduced.

In an interposer substrate according to a preferred embodiment of the present invention, the third principal surface may preferably include a plurality of third principal surfaces.

In this configuration, the number of circuit elements to be connected may be further increased. In particular, in a case in which the plurality of third principal surfaces overlap with the second principal surface, the increase in number of circuit elements and the reduction in size of the plane area of the interposer substrate are achieved together.

In an interposer substrate according to a preferred embodiment of the present invention, the body may preferably include a side surface that is connected to the first principal surface, the second principal surface, and the third principal surface, and the side surface may preferably include a shield film.

With this configuration, the radiation of noise from the inside of the interposer substrate to an external portion is able to be significantly reduced or prevented, and the leakage of noise from the outside to the inside of the interposer substrate is also able to be significantly reduced or prevented.

In an interposer substrate according to a preferred embodiment of the present invention, the shield film may preferably be provided over an entire or substantially an entire periphery of the side surface of the body.

With this configuration, noise reduction or prevention effects in all directions of the interposer substrate are able to be obtained. In addition, wraparound reduction or prevention effects of magnetic flux in the interposer substrate are able to be obtained.

In an interposer substrate according to a preferred embodiment of the present invention, the body may preferably include a magnetic body portion and a non-magnetic body portion, and the shield film may preferably be provided on a side surface of the magnetic body portion.

With this configuration, the noise reduction or prevention effects and magnetic flux confinement effects are able to be obtained.

In an interposer substrate according to a preferred embodiment of the present invention, the shield film may preferably be larger than a height of a surface mount electronic component that is mounted on the circuit board and is adjacent to the interposer substrate.

With this configuration, the radiation of noise from the inside of the interposer substrate to the surface mount electronic component adjacent to the interposer substrate is able to be significantly reduced or prevented, and the leakage of noise from the surface mount electronic component adjacent to the interposer substrate to the inside of the interposer substrate is also able to be significantly reduced or prevented.

In addition, an interposer substrate according to a preferred embodiment of the present invention may include the following configuration. The second external connection conductor may preferably be the via conductor that projects from the second principal surface of the body.

With this configuration, the second external connection conductor is engaged into the terminal conductor of the circuit element (a cable, for example) mounted on the second principal surface and is able to be bonded together. In addition, this projection shape is able to be easily provided.

A circuit module according to a preferred embodiment of the present invention includes an interposer substrate according to a preferred embodiment of the present invention described above, a circuit board that is bonded to the first external connection conductor such that the interposer substrate is mounted to the circuit board, a first circuit element (a first cable) to be bonded to the second external connection conductor, and a second circuit element (a second cable) to be bonded to the third external connection conductor. Each of the first circuit element and the second circuit element extends in a different direction.

In this configuration, since the plurality of cables are connected to the circuit board by one interposer substrate, the area to mount the plurality of cables on the circuit board is able to be efficiently obtained, and the mounting surface of the circuit board is effectively utilized mainly to mount other surface mount electronic components.

In a circuit module according to a preferred embodiment of the present invention, in a plan view, the first cable and the second cable may preferably at least partially overlap with each other.

In this configuration, the plane area of the circuit module is able to be reduced.

In addition, a method of manufacturing an interposer substrate according to a preferred embodiment of the present invention includes each of the following processes. The method of manufacturing the interposer substrate includes a step of providing a stacked body by stacking layers including a conductor pattern and a step of disposing a rigid flat plate on a first principal surface defining one end in a stacking direction of the stacked body, disposing a flat plate that is softer than the rigid flat plate on a second principal surface defining another end in the stacking direction, and performing a pressing process. The method of manufacturing the interposer substrate includes a step of firing the stacked body so as to provide a body including the first principal surface and the second principal surface, and a step of grinding a portion of the second principal surface in the body into a planar shape and providing a third principal surface.

With this configuration, the interposer substrate is able to be easily manufactured such that at least the first principal surface and the third principal surface are flat, and, further, the second principal surface is also able to be flat.

In a method of manufacturing an interposer substrate according to a preferred embodiment of the present invention, the second principal surface may preferably be made flat by grinding a remaining portion other than the portion of the second principal surface into a planar shape.

In this method, the flatness of the second principal surface is able to be improved.

In a method of manufacturing an interposer substrate according to a preferred embodiment of the present invention, in the step of providing the stacked body, a sacrificial layer may preferably be provided on a surface layer on the side of the second principal surface, and the sacrificial layer may preferably include a wiring conductor.

In this method, a shape such that the wiring conductor is projected from the second principal surface is able to be easily obtained.

In addition, in a method of manufacturing an interposer substrate according to a preferred embodiment of the present invention, the step of grinding may be performed after the step of firing.

In this method, the flatness of the second principal surface is able to be easily improved.

In addition, in a method of manufacturing an interposer substrate according to a preferred embodiment of the present invention, the step of grinding may be performed before the step of firing.

In this method, grinding is facilitated.

According to preferred embodiments of the present invention, even when the number of circuit elements to be connected increases, the mounting surface of a circuit board is able to be effectively utilized.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4A is a side view showing another configuration of the circuit module according to the first preferred embodiment of the present invention, and FIG. 4B is a side view showing another configuration of the circuit module according to the first preferred embodiment of the present invention.

FIG. 9 is a perspective view showing a configuration of an interposer substrate according to a sixth preferred embodiment of the present invention.

FIG. 19 is a side view to illustrate an arrangement of a shield film.

DETAILED DESCRIPTION OF THE PREFERRED EMBODIMENTS

Preferred embodiments of the present invention will be described in detail below with reference to the accompanying drawings.

Figure 1A:
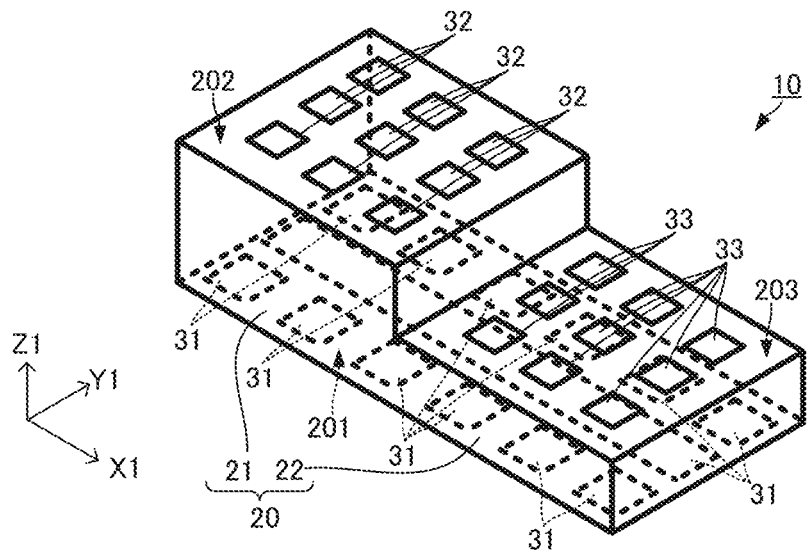
FIG. 1A is an external perspective view of an interposer substrate according to a first preferred embodiment of the present invention.
Figure 1B:
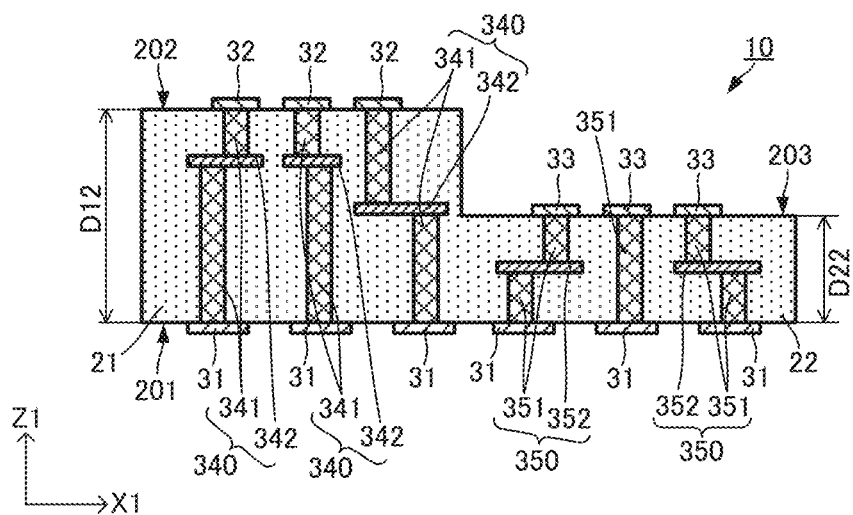
FIG. 1B is a side cross-sectional view showing a configuration of the interposer substrate according to the first preferred embodiment of the present invention.

An interposer substrate and a circuit module according to a first preferred embodiment of the present invention will be described with reference to the drawings. FIG. 1A is an external perspective view of an interposer substrate according to the first preferred embodiment of the present invention. FIG. 1B is a side cross-sectional view showing a configuration of the interposer substrate according to the first preferred embodiment of the present invention.

As shown in FIGS. 1A and 1B, an interposer substrate 10 includes a body 20, a plurality of external connection conductors 31, 32, and 33, and a plurality of wiring conductors 340 and 350.

The body 20 includes a first portion 21 and a second portion 22 that are integrated with each other. The first portion 21 and the second portion 22 are connected in an X1 direction. The body 20 includes a first principal surface 201 that is flat and has no level difference between the first portion 21 and the second portion 22. A surface facing the first principal surface 201 in the first portion 21 is a second principal surface 202 of the body 20, and a surface facing the first principal surface 201 in the second portion 22 is a third principal surface 203 of the body 20.

The thickness of the first portion 21 is larger than the thickness of the second portion 22. In other words, a distance D12 between the first principal surface 201 and the second principal surface 202 in a Z1 direction being a thickness direction (corresponding to a height direction) of the body 20 is larger than a distance D22 between the first principal surface 201 and the third principal surface 203 in the Z1 direction (D12>D22). Therefore, the body 20 includes a level difference on a side of the second principal surface 202 and third principal surface 203.

The plurality of external connection conductors 31 are provided on the first principal surface 201 in a predetermined arrangement pattern. The plurality of external connection conductors 32 are provided on the second principal surface 202 in a predetermined arrangement pattern. The plurality of external connection conductors 33 are provided on the third principal surface 203 in a predetermined arrangement pattern. An external connection conductor 31 corresponds to a "first external connection conductor", an external connection conductor 32 corresponds to a "second external connection conductor", and an external connection conductor 33 corresponds to a "third external connection conductor".

The plurality of wiring conductors 340 and 350 are provided in the inside of the body 20.

The plurality of wiring conductors 340 are provided in the inside of the first portion 21 of the body 20. A wiring conductor 340 includes a via conductor 341 that extends in the Z1 direction, and a flat conductor pattern 342 that includes a plane perpendicular or substantially perpendicular to the Z1 direction. It is to be noted that the wiring conductor 340 may include only the via conductor 341. The wiring conductor 340 connects the external connection conductor 31 and the external connection conductor 32.

The plurality of wiring conductors 350 are provided in the inside of the second portion 22 of the body 20. A wiring conductor 350 includes a via conductor 351 that extends in the Z1 direction, and a flat conductor pattern 352 that includes a plane perpendicular or substantially perpendicular to the Z1 direction. It is to be noted that the wiring conductor 350 may include only the via conductor 351. The wiring conductor 350 connects the external connection conductor 31 and the external connection conductor 33.

The body 20 is preferably made of, for example, a multilayer ceramic substrate (an LTCC substrate) obtained by stacking Low Temperature Co-fired Ceramic green sheets (ceramic layers) and sintering the sheets. The multilayer ceramic substrate is preferably manufactured by a non-shrinkage method, and the body is able to be manufactured with high precision using this multilayer ceramic substrate. The plurality of external connection conductors 31, 32, and 33 and the wiring conductors 340 and 350 preferably include, for example, a sintered metal body of a conductive material mainly made of copper or silver.

In such a configuration, as described below, the external connection conductor 31 is a terminal conductor to connect with a circuit board, and the external connection conductors 32 and 33 are terminal conductors to connect with a flat cable. As a result, the interposer substrate 10 is able to connect a plurality of flat cables to a circuit board and is able to significantly reduce or prevent a region to connect a plurality of flat cables on a surface (a component mounting surface) of the circuit board from increasing, and makes it possible to effectively utilize the surface of the circuit board.

Figure 2:
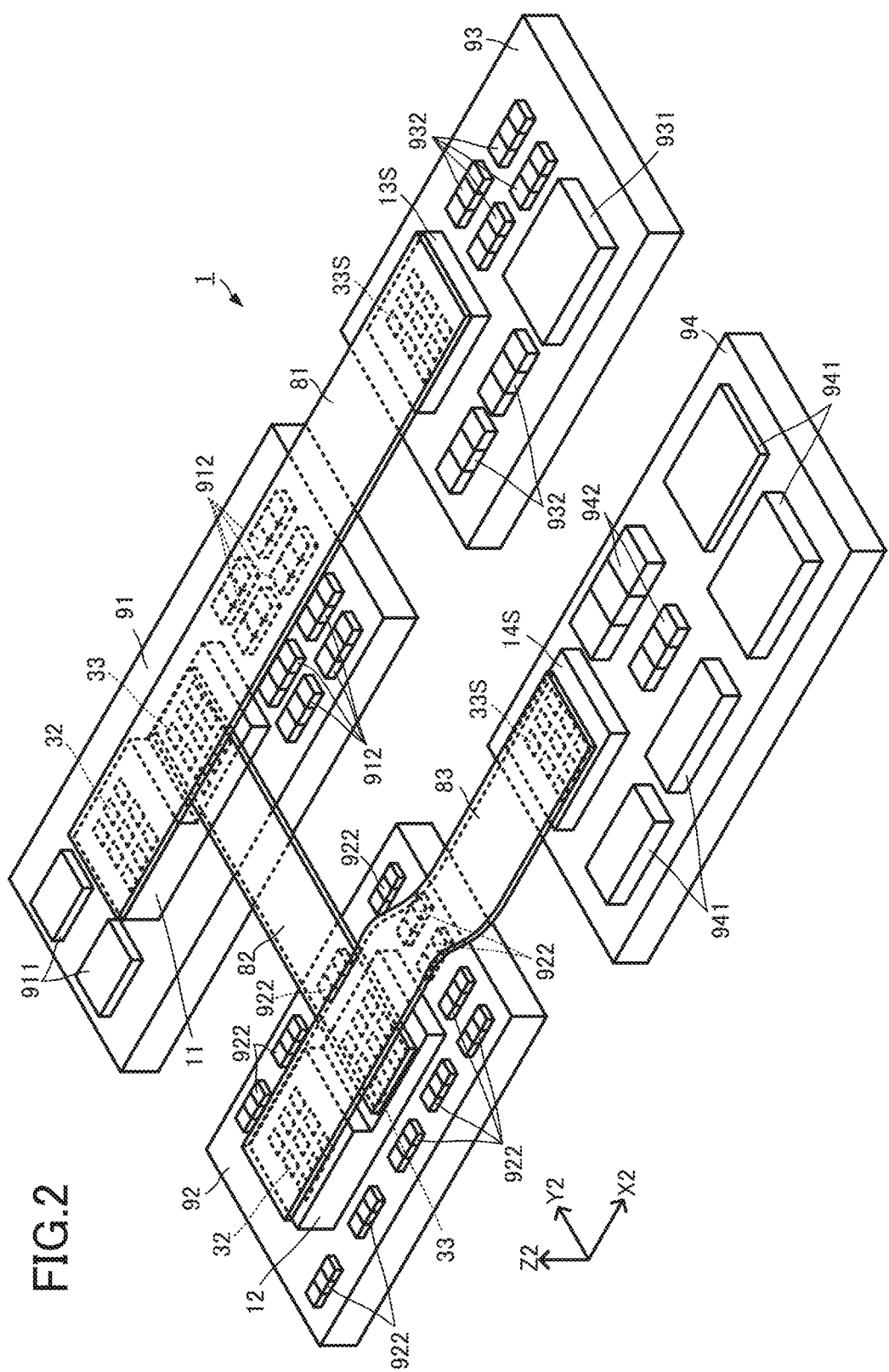
FIG. 2 is a perspective view showing a configuration of a circuit module including the interposer substrate according to the first preferred embodiment of the present invention.
Figure 3:
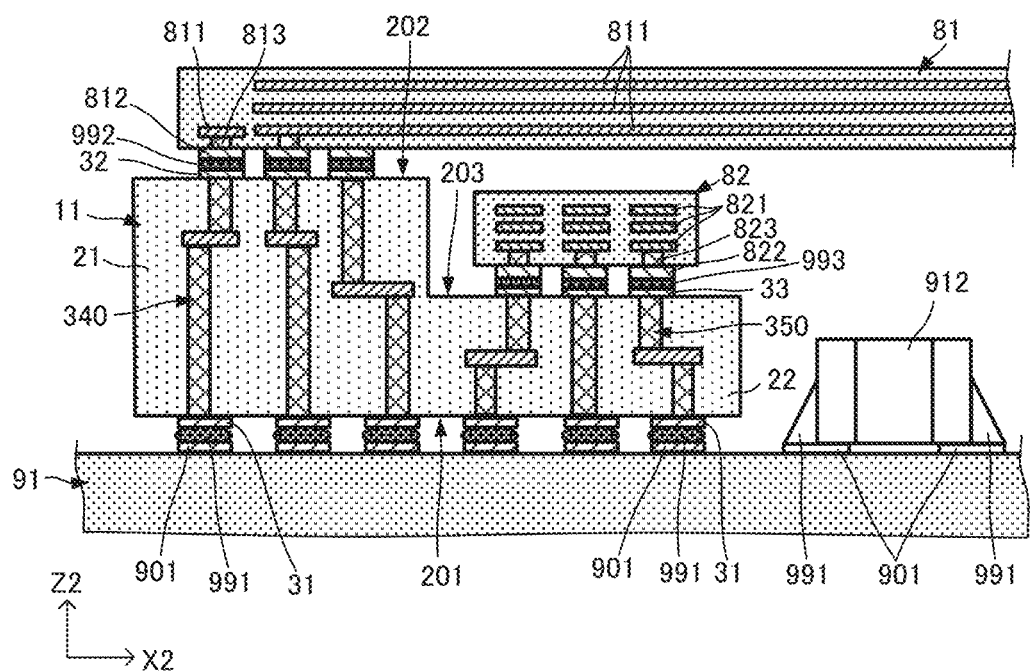
FIG. 3 is a side cross-sectional view showing a configuration in which a portion of the circuit module shown in FIG. 2 is enlarged.

FIG. 2 is a perspective view showing a configuration of a circuit module including the interposer substrate according to the first preferred embodiment of the present invention. FIG. 3 is a side cross-sectional view showing a configuration in which a portion of the circuit module shown in FIG. 2 is enlarged. It is to be noted that, in FIG. 3, in order to make FIG. 3 more visible, the addition of reference numerals is partially omitted.

As shown in FIG. 2, a circuit module 1 includes circuit boards 91, 92, 93, and 94. The circuit board 91 and the circuit board 92 are spaced apart in a Y2 direction. The circuit board 91 and the circuit board 93 are spaced apart in an X2 direction. The circuit board 93 and the circuit board 94 are spaced apart in the Y2 direction.

A plurality of surface mount electronic components 911 and 912 are mounted on the circuit board 91. In addition, an interposer substrate 11 is mounted on the circuit board 91. The interposer substrate 11 has the same or substantially the same configuration as the interposer substrate 10. The interposer substrate 11 includes a first principal surface 201 in contact with the circuit board 91. Specifically, as shown in FIG. 3, the external connection conductor 31 on the first principal surface 201 is bonded to a land conductor 901 of the circuit board 91 with a conductive bonding material 991. The conductive bonding material 991 may preferably be, for example, solder. The conductive bonding material 991 corresponds to a "first conductive bonding material".

A plurality of surface mount electronic components 922 are mounted on the circuit board 92. In addition, an interposer substrate 12 is mounted on the circuit board 92. The interposer substrate 12 has the same or substantially the same configuration as the interposer substrate 10. The interposer substrate 12 includes a first principal surface in contact with the circuit board.

A plurality of surface mount electronic components 931 and 932 are mounted on the circuit board 93. In addition, an interposer substrate 13S is mounted on the circuit board 93. The interposer substrate 13S has the same or substantially the same configuration as the second portion 22 of the interposer substrate 10. The interposer substrate 13S includes a first principal surface in contact with the circuit board.

A plurality of surface mount electronic components 941 and 942 are mounted on the circuit board 94. In addition, an interposer substrate 14S is mounted on the circuit board 94. The interposer substrate 14S has the same or substantially the same configuration as the second portion 22 of the interposer substrate 10. The interposer substrate 14S includes a first principal surface in contact with the circuit board.

As shown in FIG. 3, a flat cable 81 includes a signal conductor 811, a terminal conductor 812, and a via conductor 813. It is to be noted that, while the terminal conductor on another end is omitted in the figure, the flat cable 81 includes a terminal conductor on both ends in the extending direction of the flat cable 81. The terminal conductor 812 and the signal conductor 811 are connected by the via conductor 813. The terminal conductor 812 on one end of the flat cable 81 is connected to the external connection conductor 32 on the second principal surface 202 of the interposer substrate 11 by a conductive bonding material 992. The terminal conductor on another end of the flat cable 81 is connected to an external connection conductor 33S of the interposer substrate 13S. The flat cable 81 corresponds to a "first cable". The conductive bonding material 992 corresponds to a "second conductive bonding material".

A flat cable 82 has the same or substantially the same configuration as the flat cable 81, and includes a signal conductor 821, a terminal conductor 822, and a via conductor 823. The flat cable 82 includes a terminal conductor on both ends in the extending direction of the flat cable 82. The flat cable 82 corresponds to a "second cable".

As shown in FIG. 3, the terminal conductor 822 on one end of the flat cable 82 is connected to the external connection conductor 33 on the third principal surface 203 of the interposer substrate 11 by a conductive bonding material 993. In addition, as shown in FIG. 2, the terminal conductor on another end of the flat cable 82 is connected to the external connection conductor 33 of the interposer substrate 12. The conductive bonding material 993 corresponds to a "third conductive bonding material".

A flat cable 83 has the same or substantially the same configuration as the flat cables 81 and 82, and includes a signal conductor, a terminal conductor, and a via conductor. The flat cable 83 includes a terminal conductor on both ends in the extending direction of the flat cable 83.

The terminal conductor on one end of the flat cable 83 is connected to the external connection conductor 32 on the second principal surface of the interposer substrate 12 by a conductive bonding material. The terminal conductor on another end of the flat cable 83 is connected to the external connection conductor 33S of the interposer substrate 14S.

In such a configuration, in a plan view of the circuit board 91, the flat cable 82 and the flat cable 81 are able to be disposed so as to overlap with each other. In other words, a region in which the flat cable 82 is mounted is able to be provided below an area in which the flat cable 81 is disposed.

Similarly, in a plan view of the circuit board 92, the flat cable 83 and the flat cable 82 are able to be disposed so as to overlap with each other. In other words, a region in which the flat cable 82 is mounted is able to be provided below an area in which the flat cable 83 is disposed.

As a result, the component mounting surfaces of the circuit boards 91 and 92 are able to be effectively utilized.

In addition, the thickness (the distance D22 between the first principal surface 201 and the third principal surface 203) of the second portion 22 in the interposer substrates 11 and 12 is preferably larger than the height of the surface mount electronic components 912 and 922 adjacent to the interposer substrates 11 and 12. As a result, the flat cable mounted on the third principal surface 203 provided closer to the first principal surface 201 than to the second principal surface 202 does not contact the surface mount electronic components 912 and 922 adjacent to the interposer substrates 11 and 12, so that the flat cable is able to be easily routed, and physical and electrical interference between the flat cable and the surface mount electronic component are able to be significantly reduced or prevented.

FIG. 4A is a side view showing another configuration of the circuit module according to the first preferred embodiment of the present invention, and FIG. 4B is a side view showing another configuration of the circuit module according to the first preferred embodiment of the present invention.

As shown in FIGS. 4A and 4B, a circuit module 1A includes circuit boards 95 and 96 and a battery 990. The battery 990 is disposed between the circuit board 95 and the circuit board 96 in an X3 direction.

A plurality of surface mount electronic components 951 and 952 and an interposer substrate 15 are mounted on the circuit board 95. The interposer substrate 15 has the same or substantially the same configuration as the interposer substrate 10. The interposer substrate 15 is disposed such that a first principal surface may be in contact with the circuit board 95 and a second portion may be on the side of the battery 990 and the circuit board 96.

A plurality of surface mount electronic components 961 and 962 and an interposer substrate 16 are mounted on the circuit board 96. The interposer substrate 16 has the same or substantially the same configuration as the interposer substrate 10. The interposer substrate 16 is disposed such that a first principal surface may be in contact with the circuit board 96 and a second portion may be on the side of the battery 990 and the circuit board 95.

Flat cables 84 and 85 have the same or substantially the same configuration as the flat cables 81, 82, and 83. The flat cable 84 is connected to an external connection conductor on a second principal surface of the interposer substrate 15, and an external connection conductor on a second principal surface of the interposer substrate 16. The flat cable 85 is connected to an external connection conductor on a third principal surface of the interposer substrate 15, and an external connection conductor on a third principal surface of the interposer substrate 16.

In such a configuration, in a plan view of the circuit module 1A, the flat cable 84 overlaps with an area in which the flat cable 85 is routed. As a result, the component mounting surfaces of the circuit boards 95 and 96 are able to be further effectively utilized.

Figure 5:
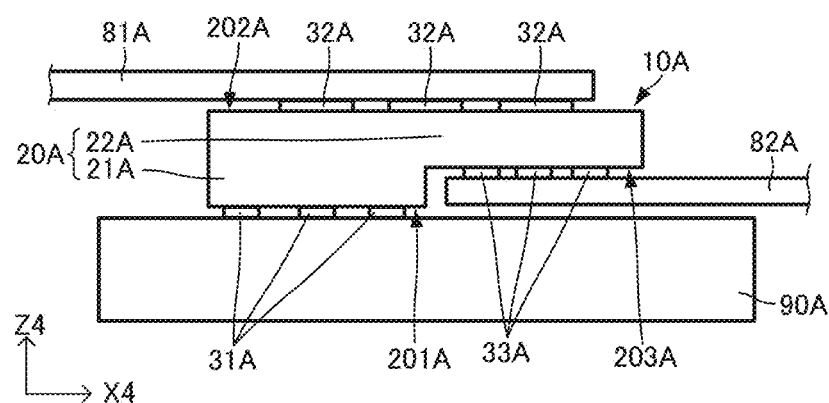
FIG. 5 is a partial enlarged side view of a portion provided with an interposer substrate in a circuit module according to a second preferred embodiment of the present invention.

Subsequently, an interposer substrate according to a second preferred embodiment of the present invention will be described with reference to the drawings. FIG. 5 is a partial enlarged side view of a portion provided with the interposer substrate in a circuit module according to the second preferred embodiment of the present invention.

As shown in FIG. 5, the interposer substrate 10A according to the second preferred embodiment has the same or substantially the same basic configuration as the interposer substrate 10 according to the first preferred embodiment, and has a different relationship of size between principal surfaces. Therefore, in the following, differences between the interposer substrate 10A and the interposer substrate 10 will be described.

In the interposer substrate 10A, a second principal surface 202A of a body 20A faces a first principal surface 201A and a third principal surface 203A. The area of the second principal surface 202A is the same or substantially the same as an area obtained by adding the area of the first principal surface 201A and the area of the third principal surface 203A. In other words, the interposer substrate 10A includes a first portion 21A between the second principal surface 202A and the first principal surface 201A in a Z4 direction, and a second portion 22A between the second principal surface 202A and the third principal surface 203A in the Z4 direction.

Accordingly, with respect to the body 20A, an external connection conductor 33A on the third principal surface 203A faces the same side as an external connection conductor 31A on the first principal surface 201A.

Although not shown, the external connection conductor 31A and the external connection conductor 32A are connected by a wiring conductor in the body 20A, and the external connection conductor 31A and the external connection conductor 33A are connected by a wiring conductor in the body 20A.

The external connection conductor 31A is connected to a circuit board 90A. The external connection conductor 32A is connected to a flat cable 81A. The external connection conductor 33A is connected to a flat cable 82A.

Even with such a configuration according to the second preferred embodiment, the same or substantially the same advantageous operational effects as the advantageous operational effects of the interposer substrate and the circuit module according to the first preferred embodiment are able to be obtained.

It is to be noted that, in the interposer substrate 10A, the external connection conductor 31A and the external connection conductor 33A are also able to be respectively connected to the external connection conductor 32A by an individual wiring conductor. In addition, in the interposer substrate 10A, the external connection conductor 31A and the external connection conductor 32A are also able to be respectively connected to the external connection conductor 33A by an individual wiring conductor.

Figure 6:
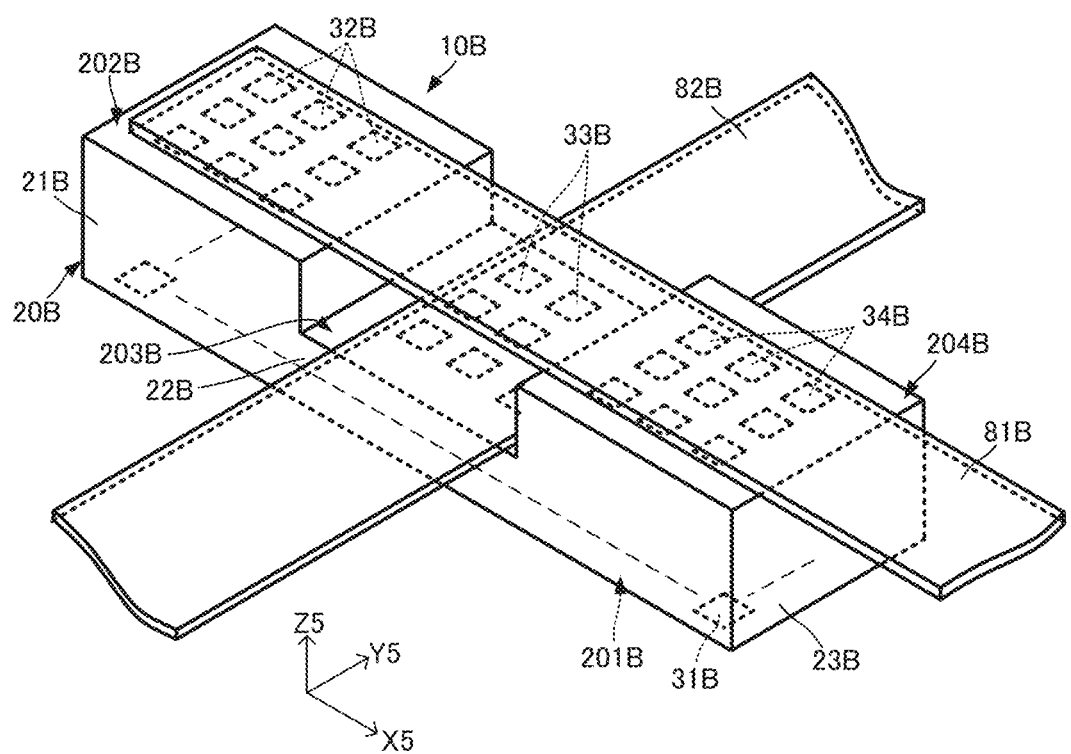
FIG. 6 is a perspective view showing a configuration of an interposer substrate according to a third preferred embodiment of the present invention.

Subsequently, an interposer substrate according to a third preferred embodiment of the present invention will be described with reference to the drawings. FIG. 6 is a perspective view showing a configuration of the interposer substrate according to the third preferred embodiment of the present invention.

As shown in FIG. 6, an interposer substrate 10B according to the third preferred embodiment is different from the interposer substrate 10 according to the first preferred embodiment in that a third portion 23B is further provided. Other configurations of the interposer substrate 10B are the same as or similar to the configurations of the interposer substrate 10, and a description of the same or similar configurations will be omitted.

As shown in FIG. 6, the interposer substrate 10B includes a body 20B. The body 20B includes a first portion 21B, a second portion 22B, and a third portion 23B that are integrated with one another. The first portion 21B, the second portion 22B, and the third portion 23B are arranged in this order and connected in an X5 direction.

The body 20B includes a first principal surface 201B that is a flat plane over the first portion 21B, the second portion 22B, and the third portion 23B. A plurality of external connection conductors 31B are provided in an array on the first principal surface 201B.

A plurality of external connection conductors 32B are provided in an array on a second principal surface 202B facing the first principal surface 201B in the first portion 21B. A plurality of external connection conductors 33B are provided in an array on a third principal surface 203B facing the first principal surface 201B in the second portion 22B. A plurality of external connection conductors 34B are provided in an array on a fourth principal surface 204B facing the first principal surface 201B in the third portion 23B.

The external connection conductors 32B, 33B, and 34B are respectively connected to the external connection conductors 31B through a wiring conductor (not shown) in the body 20B. The external connection conductor 31B to which the external connection conductor 32B is to be connected, the external connection conductor 31B to which the external connection conductor 33B is to be connected, and the external connection conductor 31B to which the external connection conductor 34B is to be connected may be different from one another or may be the same as one another.

A distance (a distance in a Z5 direction) between the first principal surface 201B and the second principal surface 202B is larger than a distance (a distance in the Z5 direction) between the first principal surface 201B and the third principal surface 203B, and is the same or substantially the same as a distance (a distance in the Z5 direction) between the first principal surface 201B and the fourth principal surface 204B.

The plurality of external connection conductors 31B are connected to a circuit board (not shown). The plurality of external connection conductors 32B and 34B are connected to a terminal conductor (not shown) of a flat cable 81B extending in the X5 direction. The plurality of external connection conductors 33B are connected to a terminal conductor (not shown) of a flat cable 82B extending in a Y5 direction.

Even with such a configuration according to the third preferred embodiment, the same or substantially the same advantageous operational effects as the advantageous operational effects of the interposer substrate and the circuit module according to the first and second preferred embodiments are able to be obtained.

Figure 7:
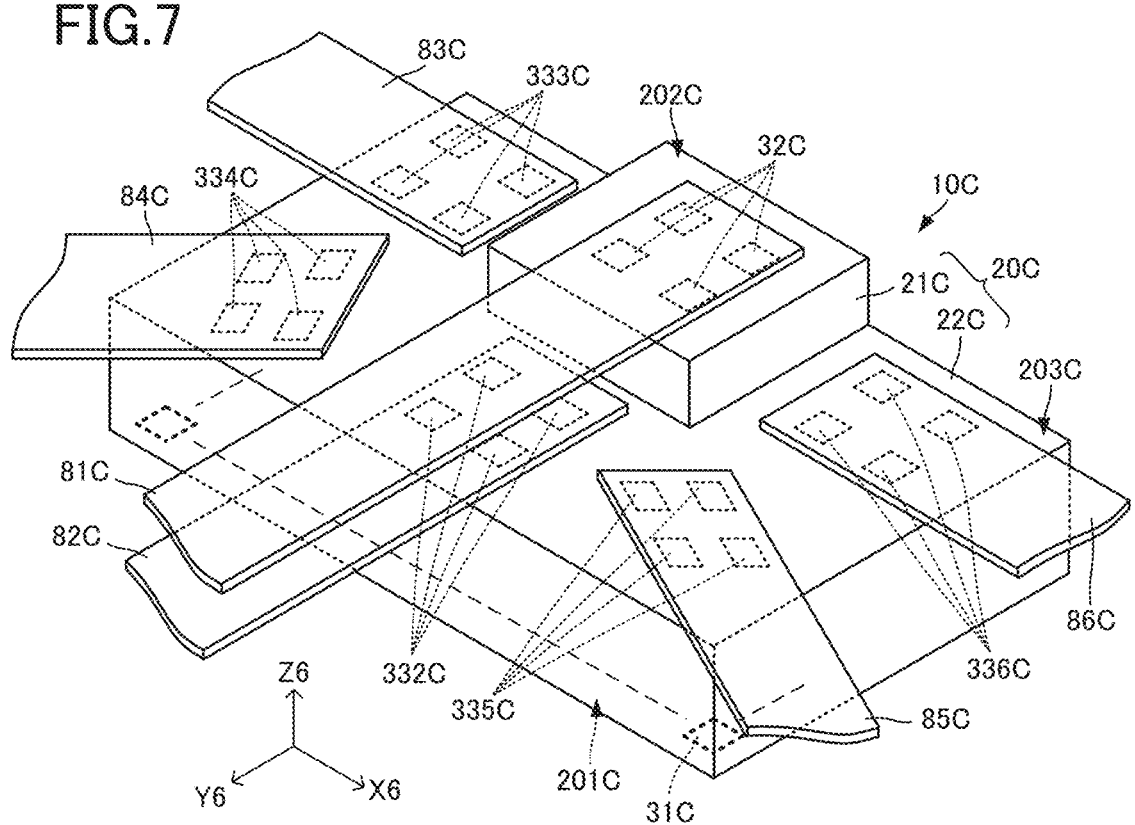
FIG. 7 is a perspective view showing a configuration of an interposer substrate according to a fourth preferred embodiment of the present invention.

Subsequently, an interposer substrate according to a fourth preferred embodiment of the present invention will be described with reference to the drawings. FIG. 7 is a perspective view showing a configuration of the interposer substrate according to the fourth preferred embodiment of the present invention.

As shown in FIG. 7, an interposer substrate 10C according to the fourth preferred embodiment is different from the interposer substrate 10 according to the first preferred embodiment in that the shape of a second portion is different and in that the second portion includes a plurality of sets of external connection conductors for each flat cable. Other configurations of the interposer substrate 10C are the same as or similar to the configurations of the interposer substrate 10, and a description of the same or similar configurations will be omitted.

As shown in FIG. 7, the interposer substrate 10C includes a body 20C. The body 20C includes a first portion 21C and a second portion 22C that are integrated with each other. The body 20C has a rectangular or substantially rectangular shape in a plan view. In a plan view of the body 20C, the second portion 22C, with respect to the first portion 21C, is connected to both sides in an X6 direction and to one side in a Y6 direction.

The body 20C includes a first principal surface 201C that is a flat plane over the first portion 21C and the second portion 22C. A plurality of external connection conductors 31C are provided in an array on the first principal surface 201C.

A plurality of external connection conductors 32C are provided in an array on a second principal surface 202C facing the first principal surface 201C in the first portion 21C.

A plurality of external connection conductors 332C, 333C, 334C, 335C, and 336C are provided on a third principal surface 203C facing the first principal surface 201C in the second portion 22C. The plurality of external connection conductors 332C are used to connect a flat cable 82C, and the plurality of external connection conductors 333C are used to connect a flat cable 83C. The plurality of external connection conductors 334C are used to connect a flat cable 84C, the plurality of external connection conductors 335C are used to connect a flat cable 85C, and the plurality of external connection conductors 336C are used to connect a flat cable 86C.

The plurality of external connection conductors 332C, in the second portion 22C, are disposed on a first side in the Y6 direction with respect to the first portion 21C. The plurality of external connection conductors 333C, in the second portion 22C, are disposed on a first side in the X6 direction with respect to the first portion 21C. The plurality of external connection conductors 334C, in the second portion 22C, are disposed on the first side in the X6 direction and on the first side in the Y6 direction with respect to the first portion 21C. The plurality of external connection conductors 335C, in the second portion 22C, are disposed on a second side in the X6 direction and on the first side in the Y6 direction with respect to the first portion 21C. The plurality of external connection conductors 336C, in the second portion 22C, are disposed on the second side in the X6 direction with respect to the first portion 21C. In other words, the plurality of external connection conductors 332C, 333C, 334C, 335C, and 336C are arrayed with a predetermined space along a circle around the first portion 21C.

The plurality of external connection conductors 32C, 332C, 333C, 334C, 335C, and 336C are respectively connected to the external connection conductors 31C through a wiring conductor (not shown) in the body 20C. The external connection conductors 31C to which each of the plurality of external connection conductors 32C, 332C, 333C, 334C, 335C, and 336C is to be connected may be different from one another or may be the same as one another.

A distance (a distance in a Z6 direction) between the first principal surface 201C and the second principal surface 202C is larger than a distance (a distance in the Z6 direction) between the first principal surface 201C and the third principal surface 203C.

The plurality of external connection conductors 31C are connected to a circuit board (not shown). The plurality of external connection conductors 32C are connected to a terminal conductor (not shown) of a flat cable 81C extending in the Y6 direction. The plurality of external connection conductors 332C are connected to a terminal conductor (not shown) of the flat cable 82C extending in the Y6 direction. In a plan view, the flat cable 82C overlaps with the flat cable 81C.

The plurality of external connection conductors 333C are connected to a terminal conductor (not shown) of the flat cable 83C extending toward a first side in the X6 direction. The plurality of external connection conductors 334C are connected to a terminal conductor (not shown) of the flat cable 84C extending toward the first side in the X6 direction and a first side in the Y6 direction. The plurality of external connection conductors 335C are connected to a terminal conductor (not shown) of the flat cable 85C extending toward a second side in the X6 direction and the first side in the Y6 direction. The plurality of external connection conductors 336C are connected to a terminal conductor (not shown) of the flat cable 86C extending toward the second side in the X6 direction. In other words, the flat cables 82C, 83C, 84C, 85C, and 86C are substantially radially disposed around the first portion 21C.

Even with such a configuration according to the fourth preferred embodiment, the same or substantially the same advantageous operational effects as the advantageous operational effects of the interposer substrate and the circuit module according to each of the above-described preferred embodiments are able to be obtained.

Figure 8:
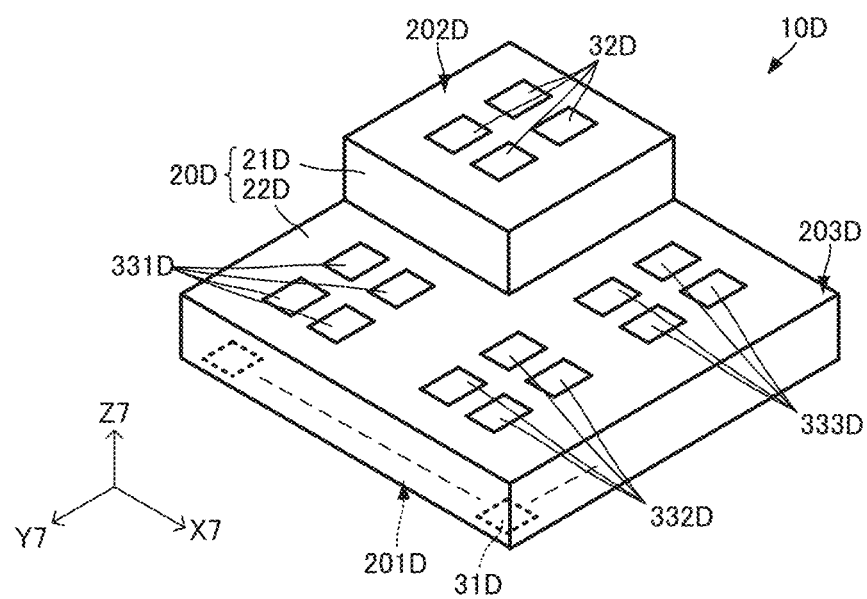
FIG. 8 is a perspective view showing a configuration of an interposer substrate according to a fifth preferred embodiment of the present invention.

Subsequently, an interposer substrate according to a fifth preferred embodiment of the present invention will be described with reference to the drawings. FIG. 8 is a perspective view showing a configuration of the interposer substrate according to the fifth preferred embodiment of the present invention.

As shown in FIG. 8, an interposer substrate 10D according to the fifth preferred embodiment has the same or substantially the same structure as the interposer substrate 10C according to the fourth preferred embodiment and is different from the interposer substrate 10 according to the first preferred embodiment in that the shape of a second portion is different and in that the second portion includes a plurality of sets of external connection conductors for each flat cable. Other configurations of the interposer substrate 10D are the same as or similar to the configurations of the interposer substrates 10 and 10C, and a description of the same or similar configurations will be omitted.

As shown in FIG. 8, the interposer substrate 10D includes a body 20D. The body 20D includes a first portion 21D and a second portion 22D that are integrated with each other. The body 20D has a rectangular or substantially rectangular shape in a plan view. In a plan view of the body 20D, the second portion 22D, with respect to the first portion 21D, is connected to one side in the X6 direction and one side in the Y6 direction.

The body 20D includes a first principal surface 201D that is a flat plane over the first portion 21D and the second portion 22D. A plurality of external connection conductors 31D are provided in an array on the first principal surface 201D.

A plurality of external connection conductors 32D are provided in an array on a second principal surface 202D facing the first principal surface 201D in the first portion 21D.

A plurality of external connection conductors 331D, 332D, and 333D are provided on a third principal surface 203D facing the first principal surface 201D in the second portion 22D. The external connection conductors 331D, 332D, and 333D may be used to connect a different flat cable, and, for example, the external connection conductors 331D and 332D may be used to connect the same flat cable, and the external connection conductor 333D may be used to connect a different flat cable.

The plurality of external connection conductors 32D, 331D, 332D, and 333D are respectively connected to the external connection conductors 31D through a wiring conductor (not shown) in the body 20D. The external connection conductors 31D to which each of the plurality of external connection conductors 32D, 331D, 332D, and 333D to be connected may be different from one another or may be the same as one another.

A distance (a distance in the Z6 direction) between the first principal surface 201C and the second principal surface 202C is larger than a distance (a distance in the Z6 direction) between the first principal surface 201C and the third principal surface 203C.

The plurality of external connection conductors 31D are connected to a circuit board (not shown). The plurality of external connection conductors 32D, 331D, 332D, and 333D are respectively connected to a terminal conductor of a flat cable (not shown).

Even with such a configuration according to the fifth preferred embodiment, the same or substantially the same advantageous operational effects as the advantageous operational effects of the interposer substrate and the circuit module according to each of the above preferred embodiments are able to be obtained.

Subsequently, an interposer substrate according to a sixth preferred embodiment of the present invention will be described with reference to the drawings. FIG. 9 is a perspective view showing a configuration of the interposer substrate according to the sixth preferred embodiment of the present invention.

As shown in FIG. 9, an interposer substrate 10E according to the sixth preferred embodiment, similarly to the interposer substrate 10B according to the third preferred embodiment, is different from the interposer substrate 10 according to the first preferred embodiment in that a third portion 23E is further provided. Other configurations of the interposer substrate 10E are the same as or similar to the configurations of the interposer substrates 10 and 10B, and a description of the same or similar configurations will be omitted.

As shown in FIG. 9, the interposer substrate 10E includes a body 20E. The body 20E includes a first portion 21E, a second portion 22E, and a third portion 23E that are integrated with one another. The first portion 21E, the second portion 22E, and the third portion 23E are arranged in this order and connected in an X8 direction.

The body 20E includes a first principal surface 201E that is a flat plane over the first portion 21E, the second portion 22E, and the third portion 23E. A plurality of external connection conductors 31E are provided in an array on the first principal surface 201E.

A plurality of external connection conductors 32E are provided in an array on a second principal surface 202E facing the first principal surface 201E in the first portion 21E. A plurality of external connection conductors 33E are provided in an array on a third principal surface 203E facing the first principal surface 201E in the second portion 22E. A plurality of external connection conductors 34E are provided in an array on a fourth principal surface 204E facing the first principal surface 201E in the third portion 23E.

The external connection conductors 32E, 33E, and 34E are respectively connected to the external connection conductors 31E through a wiring conductor (not shown) in the body 20E. An external connection conductor 31E to which an external connection conductor 32E is to be connected, an external connection conductor 31E to which an external connection conductor 33E is to be connected, and an external connection conductor 31E to which an external connection conductor 34E is to be connected may be different from one another or may be the same as one another.

A distance (a distance in a Z8 direction) between the first principal surface 201E and the second principal surface 202E is larger than a distance (a distance in the Z8 direction) between the first principal surface 201E and the third principal surface 203E. A distance (a distance in the Z8 direction) between the first principal surface 201E and the third principal surface 203E is larger than a distance (a distance in the Z8 direction) between the first principal surface 201E and the fourth principal surface 204E. In other words, the body 20E has a stepped shape such that the height is sequentially reduced in the X8 direction.

The plurality of external connection conductors 31E are connected to a circuit board (not shown). The plurality of external connection conductors 32E, 33E, and 34E are respectively connected to a terminal conductor of a different flat cable (not shown).

Even with such a configuration according to the sixth preferred embodiment, the same or substantially the same advantageous operational effects as the advantageous operational effects of the interposer substrate and the circuit module according to each of the above preferred embodiments are able to be obtained.

Figure 10A:
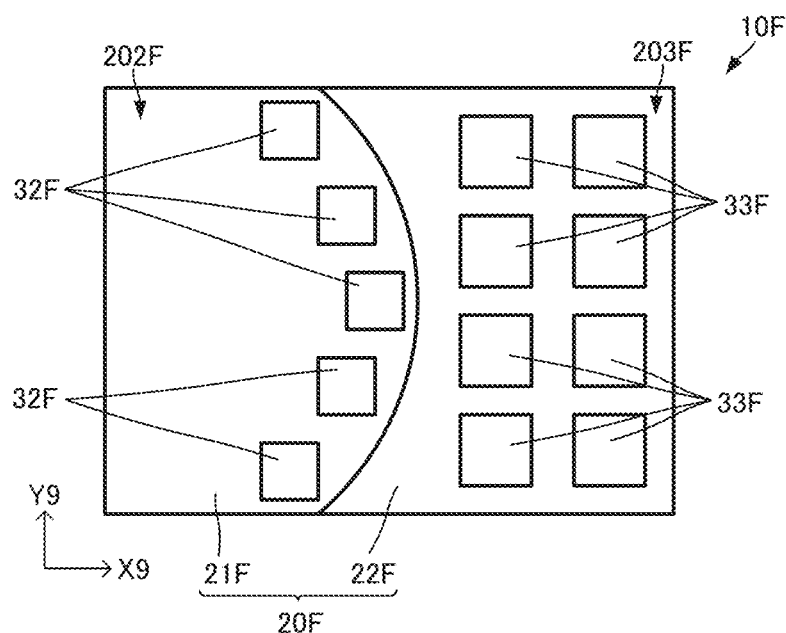
FIG. 10A is a plan view showing a configuration of an interposer substrate according to a seventh preferred embodiment of the present invention.

Subsequently, an interposer substrate according to a seventh preferred embodiment of the present invention will be described with reference to the drawings. FIG. 10A is a plan view showing a configuration of an interposer substrate according to a seventh preferred embodiment of the present invention, and FIG. 10B is a side view showing the configuration of the interposer substrate according to the seventh preferred embodiment of the present invention.

Figure 10B:
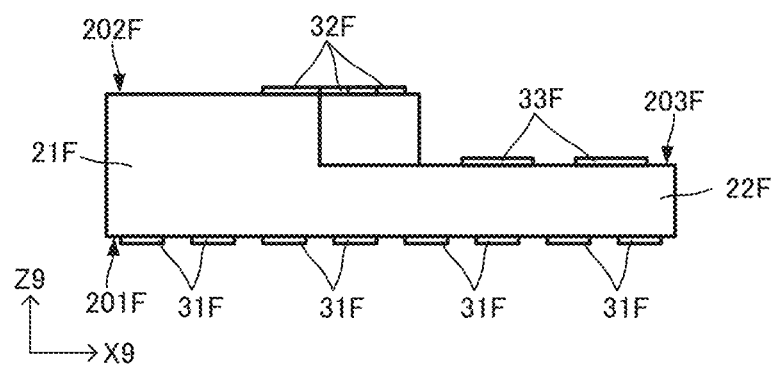
FIG. 10B is a side view showing the configuration of the interposer substrate according to the seventh preferred embodiment of the present invention.

As shown in FIGS. 10A and 10B, an interposer substrate 10F according to the seventh preferred embodiment is different in the shape of a first portion 21F and a second portion 22F from the interposer substrate 10 according to the first preferred embodiment. Other configurations of the interposer substrate 10F are the same as or similar to the configurations of the interposer substrate 10, and a description of the same or similar configurations will be omitted.

The boundary between the first portion 21F and the second portion 22F has a shape of an arc in a plan view of the body 20F.

A plurality of external connection conductors 31F are provided in an array on a first principal surface 201F. A plurality of external connection conductors 32F are provided in an array on a second principal surface 202F of the first portion 21F, and a plurality of external connection conductors 33F are provided in an array on a third principal surface 203F of the second portion 22F.

The plurality of external connection conductors 32F are disposed along with the arc of the second principal surface 202F.

Even with such a configuration according to the seventh preferred embodiment, the same or substantially the same advantageous operational effects as the advantageous operational effects of the interposer substrate and the circuit module according to each of the above preferred embodiments are able to be obtained.

Figure 11:
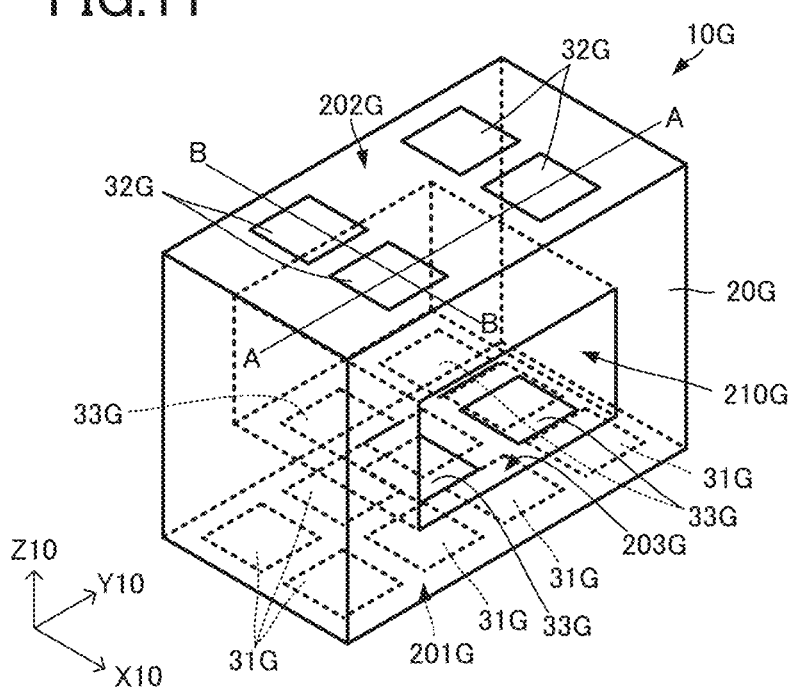
FIG. 11 is a perspective view showing a configuration of an interposer substrate according to an eighth preferred embodiment of the present invention.
Figure 12A:
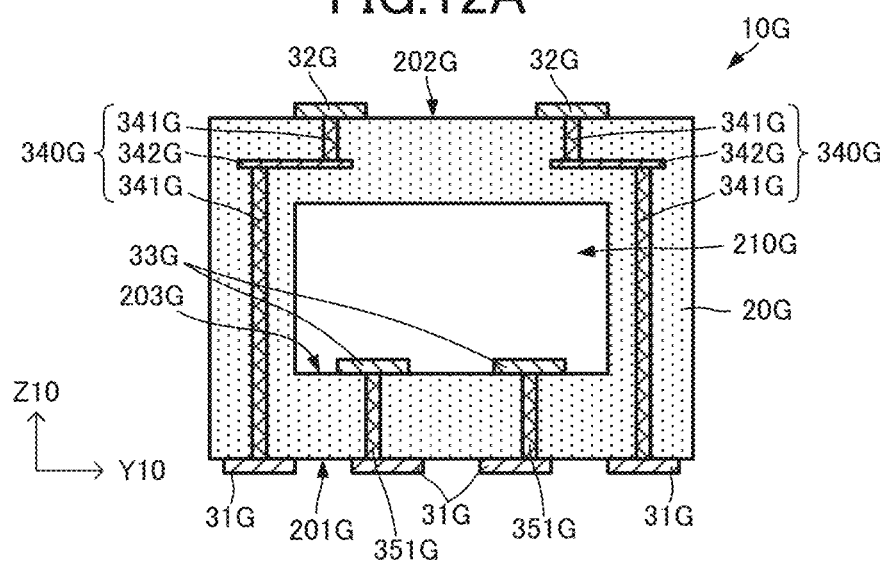
FIGS. 12A and 12B are cross-sectional views of the interposer substrate according to the eighth preferred embodiment of the present invention.
Figure 12B:
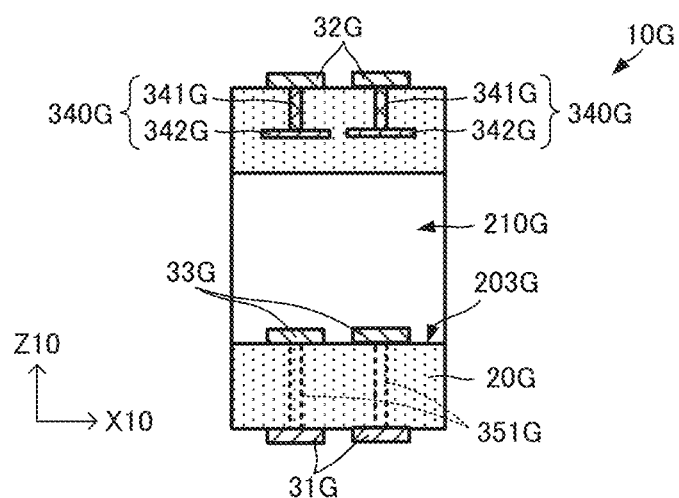

Subsequently, an interposer substrate according to an eighth preferred embodiment of the present invention will be described with reference to the drawings. FIG. 11 is a perspective view showing a configuration of the interposer substrate according to the eighth preferred embodiment of the present invention. FIG. 12A is a cross-sectional view of the interposer substrate according to the eighth preferred embodiment of the present invention and shows an A-A section of FIG. 11. FIG. 12B is a cross-sectional view of the interposer substrate according to the eighth preferred embodiment of the present invention and shows a B-B section of FIG. 11.

As shown in FIG. 11, FIGS. 12A and 12B, the interposer substrate 10G according to the eighth preferred embodiment is different from the interposer substrate 10 according to the first preferred embodiment in that, in a plan view of the interposer substrate 10G, a third principal surface 203G overlaps with both of a first principal surface 201G and a second principal surface 202G. Other configurations of the interposer substrate 10G are the same as or similar to the configurations of the interposer substrate 10, and a description of the same or similar configurations will be omitted.

The interposer substrate 10G includes a body 20G. The body 20G includes a concave portion 210G that penetrates (extending in an X10 direction) between lateral sides (surfaces in parallel to Y10 and Z10 directions) facing each other in the body 20G. A surface on the side of the first principal surface 201G in the concave portion 210G is defined as the third principal surface 203G.

An external connection conductor 31G is provided on the first principal surface 201G, an external connection conductor 32G is provided on the second principal surface 202G, and an external connection conductor 33G is provided on the third principal surface 203G. The external connection conductor 31G is connected to the external connection conductor 32G through a wiring conductor 340G in the body 20G. The wiring conductor 340G includes a via conductor 341G and a flat conductor pattern 342G. The external connection conductor 31G is connected to the external connection conductor 33G through a via conductor 351G in the body 20G.

In such a configuration, since the first principal surface 201G, the second principal surface 202G, and the third principal surface 203G overlap with one another in a plan view, the plane area of the body 20G is able to be reduced.

It is to be noted that a region in which the external connection conductor 32G on the second principal surface 202G is provided and a region in which the external connection conductor 33G on the third principal surface 203G is provided may not completely overlap with each other. For example, the regions may partially overlap in the Y10 direction.

Figure 13A:
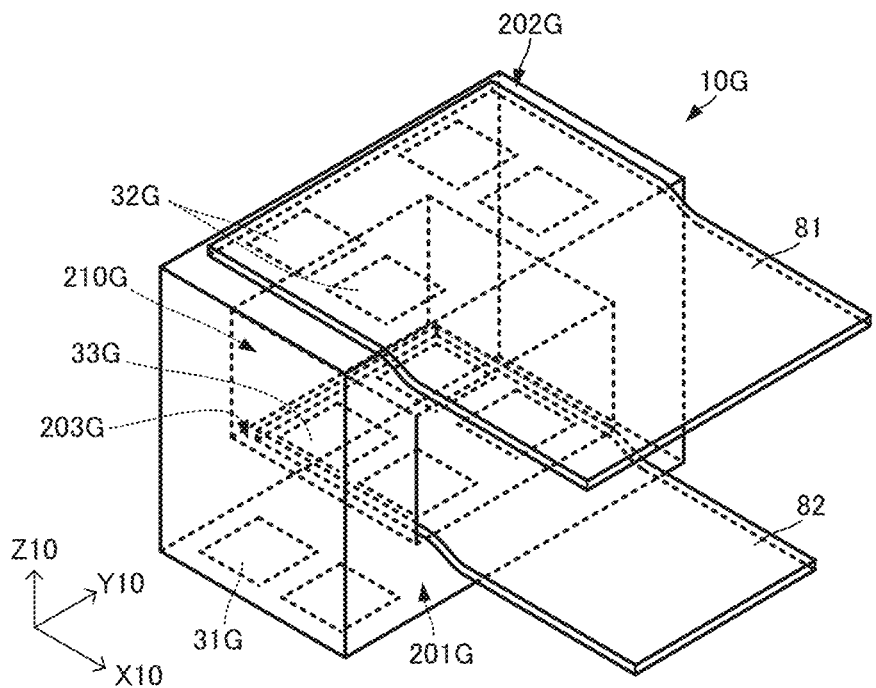
FIG. 13A is a diagram showing a first aspect in which a flat cable is connected to the interposer substrate according to the eighth preferred embodiment of the present invention.
Figure 13B:
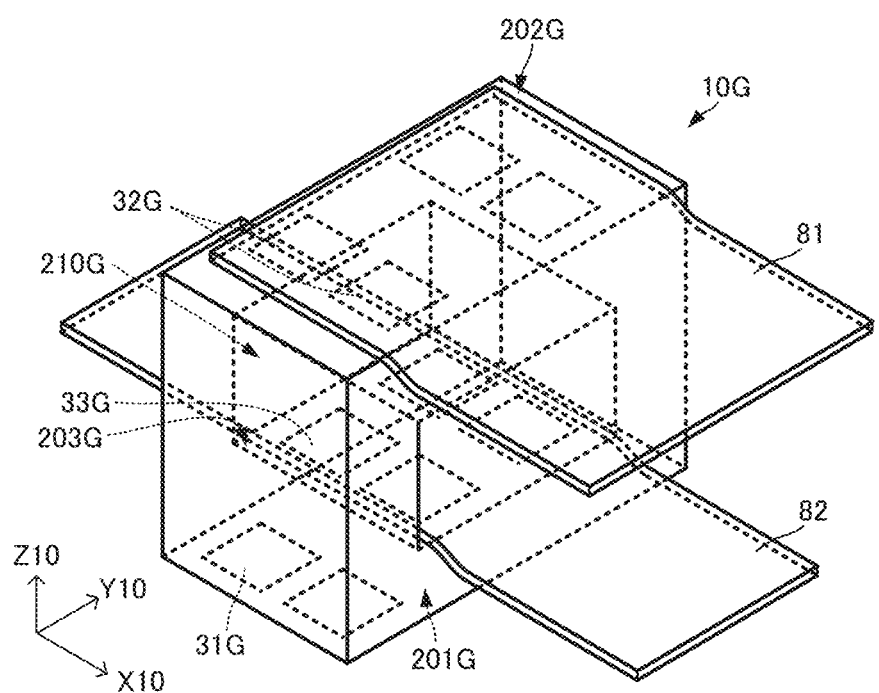
FIG. 13B is a diagram showing a second aspect in which a flat cable is connected to the interposer substrate according to the eighth preferred embodiment of the present invention.

Such an interposer substrate 10G is used as shown in FIGS. 13A and 13B. FIG. 13A is a diagram showing a first aspect in which a flat cable is connected to the interposer substrate according to the eighth preferred embodiment of the present invention, and FIG. 13B is a diagram showing a second aspect in which a flat cable is connected to the interposer substrate according to the eighth preferred embodiment of the present invention.

In the aspect shown in FIG. 13A, a flat cable 81 is disposed so as to be substantially in contact with the second principal surface 202G. A flat cable 82 is disposed so as to be substantially in contact with the third principal surface 203G. In such a case, an end of the flat cable 82 is housed in the concave portion 210G.

In the aspect shown in FIG. 13B, the flat cable 81 is disposed so as to be substantially in contact with the second principal surface 202G. The flat cable 82 is disposed so as to be substantially in contact with the third principal surface 203G. In such a case, the flat cable 82 passes through the concave portion 210G.

Figure 14:
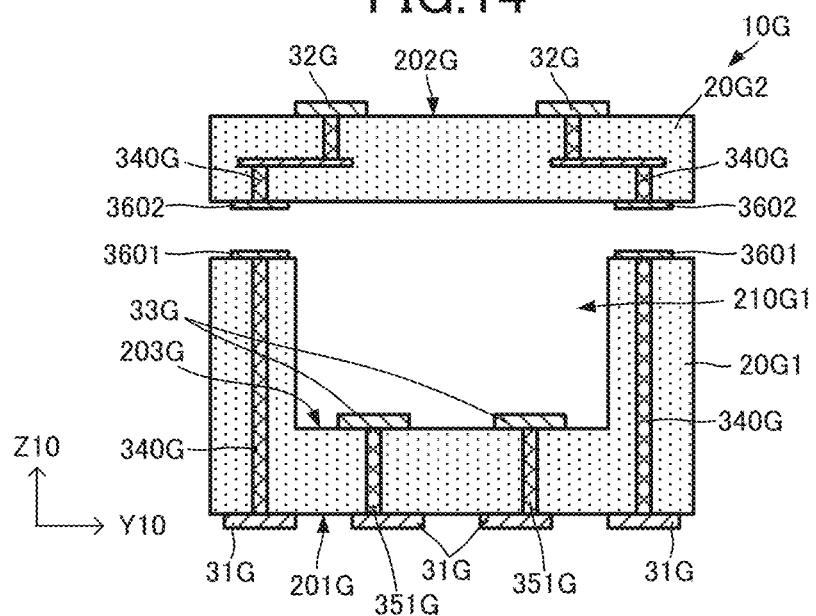
FIG. 14 is a cross-sectional view to illustrate a method of manufacturing the interposer substrate according to the eighth preferred embodiment of the present invention.

Such an interposer substrate 10G is preferably manufactured by a non-limiting example of a method as shown in FIG. 14, for example. FIG. 14 is a cross-sectional view to illustrate a method of manufacturing the interposer substrate according to the eighth preferred embodiment of the present invention.

As shown in FIG. 14, a body includes a first portion 20G1 that includes a concave portion 210G1, and a second portion 20G2 having a flat plate shape. A bonding conductor pattern 3601 is provided on an end surface opposite to the first principal surface 201G in the first portion 20G1. A bonding conductor pattern 3602 is provided on a surface opposite to the second principal surface 202G in the second portion 20G2.

The bonding conductor patterns 3601 and the bonding conductor patterns 3602 are bonded with solder or other suitable material, which provides a body 20G that includes the concave portion 210G as shown in FIGS. 12A and 12B. As a result, the body 20G that includes the concave portion 210G is able to be easily provided.

It is to be noted that, while FIG. 14 shows the aspect in which the concave portion 210G1 is provided in the first portion 20G1, the concave portion may be provided in the second portion 20G2, and the first portion 20G1 may be a flat plate. Further, a flat plate-shaped first portion to provide a first principal surface 201G, a flat plate-shaped second portion to provide a second principal surface 202G, and a side wall portion to provide a concave portion may be individually provided and may be bonded to one another.

Figure 15:
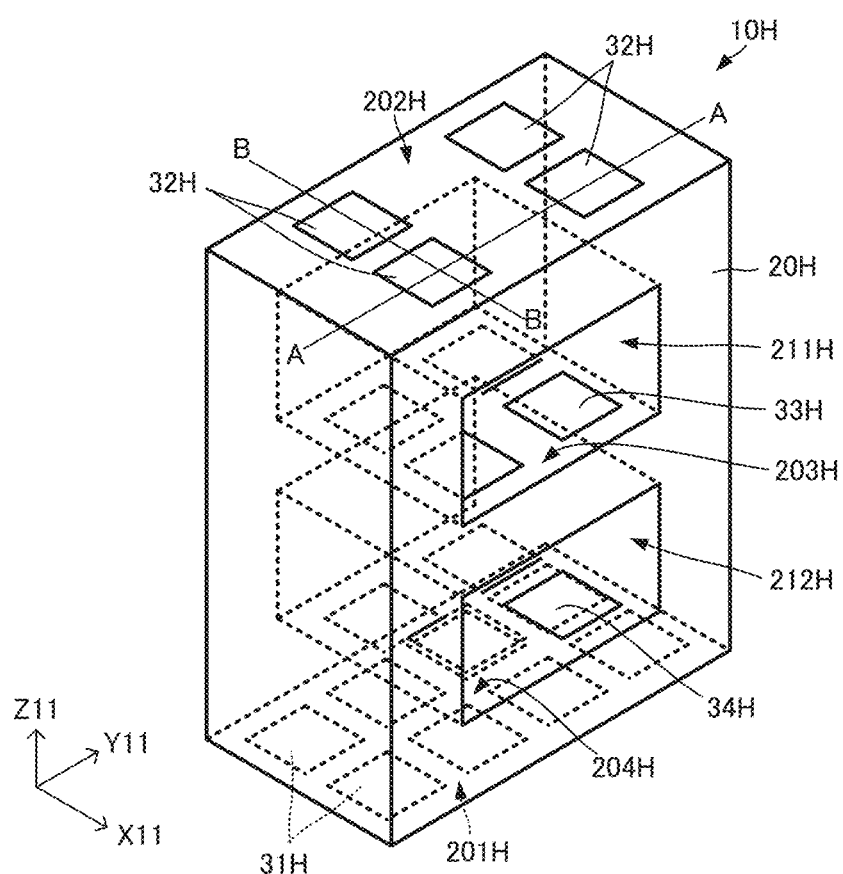
FIG. 15 is a perspective view showing a configuration of an interposer substrate according to a ninth preferred embodiment of the present invention.
Figure 16A:
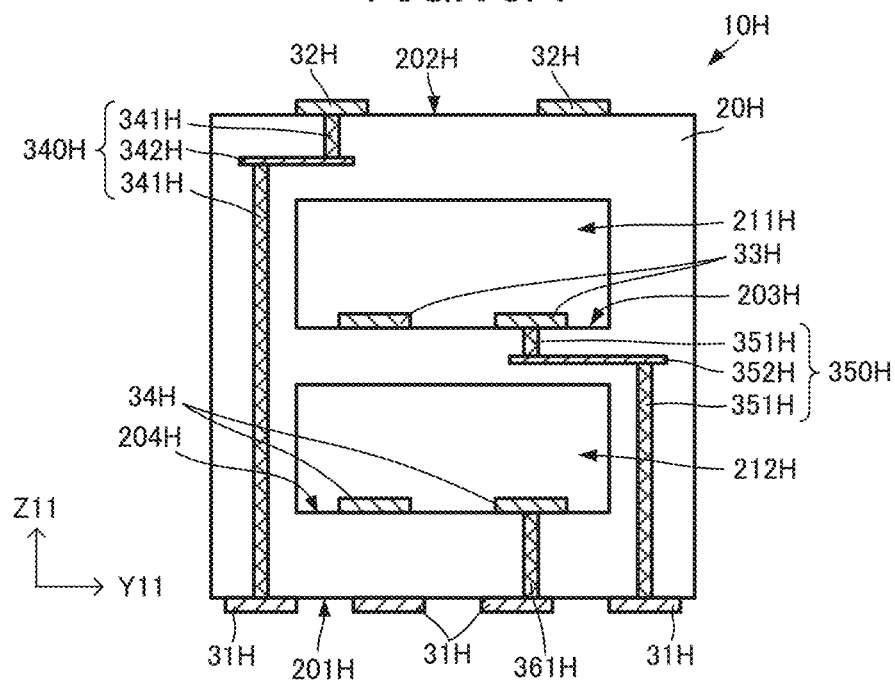
FIGS. 16A and 16B are cross-sectional views of the interposer substrate according to the ninth preferred embodiment of the present invention.
Figure 16B:
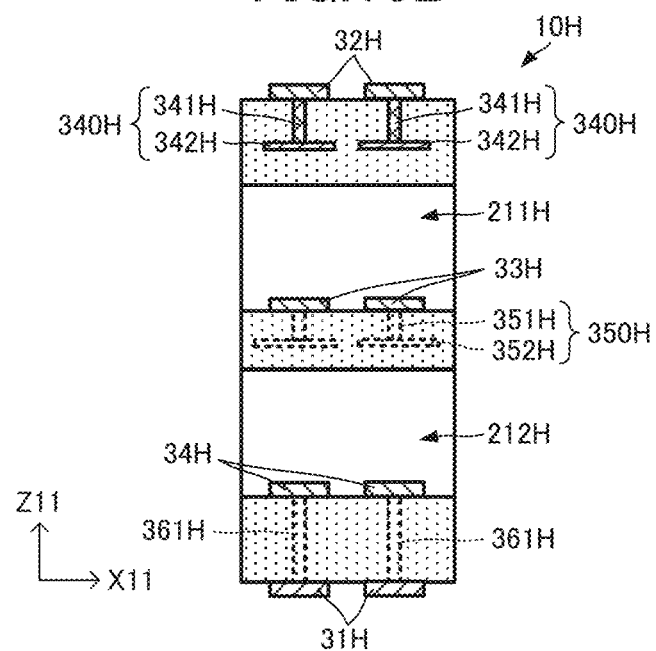

Subsequently, an interposer substrate according to a ninth preferred embodiment of the present invention will be described with reference to the drawings. FIG. 15 is a perspective view showing a configuration of the interposer substrate according to the ninth preferred embodiment of the present invention. FIG. 16A is a cross-sectional view of the interposer substrate according to the ninth preferred embodiment of the present invention and shows an A-A section of FIG. 15. FIG. 16B is a cross-sectional view of the interposer substrate according to the ninth preferred embodiment of the present invention and shows a B-B section of FIG. 15.

As shown in FIG. 15 and FIGS. 16A and 16B, an interposer substrate 10H according to the ninth preferred embodiment is different in the number of concave portions from the interposer substrate 10G according to the eighth preferred embodiment. Other configurations of the interposer substrate 10H are the same as or similar to the configurations of the interposer substrate 10G, and a description of the same or similar configurations will be omitted.

The interposer substrate 10H includes a body 20H. The body 20H includes a concave portion 211H and a concave portion 212H each of which penetrates (extending in an X10 direction) between lateral sides (surfaces in parallel to the Y10 and Z10 directions) facing each other in the body 20H. The concave portion 211H and the concave portion 212H are provided in parallel or substantially in parallel to each other with a space therebetween in the height direction (the thickness direction, a Z11 direction) of the body 20H. A surface on the side of a first principal surface 201H in the concave portion 211H is defined as a third principal surface 203H, and a surface on the side of the first principal surface 201H in the concave portion 212H is defined as a fourth principal surface 204H.

An external connection conductor 31H is provided on the first principal surface 201H, and an external connection conductor 32H is provided on a second principal surface 202H. An external connection conductor 33H is provided on the third principal surface 203H, and an external connection conductor 34H is provided on the fourth principal surface 204H. The external connection conductor 31H is connected to the external connection conductor 32H through a wiring conductor 340H in the body 20H. The wiring conductor 340H includes a via conductor 341H and a flat conductor pattern 342H. The external connection conductor 31H is connected to the external connection conductor 33H through a wiring conductor 350H in the body 20H. The wiring conductor 350H includes a via conductor 351H and a flat conductor pattern 352H. The external connection conductor 31H is connected to the external connection conductor 34H through a via conductor 361H in the body 20H.

In such a configuration, the first principal surface 201H, the second principal surface 202H, the third principal surface 203H, and the fourth principal surface 204H overlap with one another in a plan view, so that the plane area of the body 20H is able to be reduced while an area to be used for connection by the interposer substrate 10H is able to be increased.

It is to be noted that a region in which the external connection conductor 32H on the second principal surface 202H is provided, a region in which the external connection conductor 33H on the third principal surface 203H is provided, and a region in which the external connection conductor 34H on the fourth principal surface 204H is provided may not completely overlap with one another. For example, the regions may partially overlap in a Y11 direction.

In addition, the region in which the external connection conductor 33H on the third principal surface 203H is provided and the region in which the external connection conductor 34H on the fourth principal surface 204H is provided may be arranged alongside one another in the Y11 direction.

Figure 17:
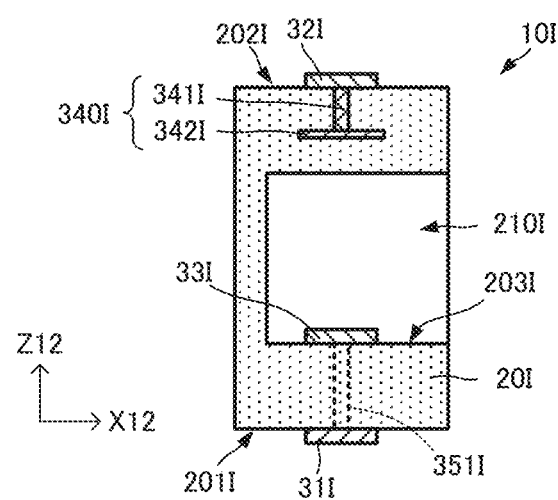
FIG. 17 is a cross-sectional view of an interposer substrate according to a tenth preferred embodiment of the present invention.

Subsequently, an interposer substrate according to a tenth preferred embodiment of the present invention will be described with reference to the drawings. FIG. 17 is a cross-sectional view of the interposer substrate according to the tenth preferred embodiment of the present invention.

As shown in FIG. 17, an interposer substrate 10I according to the tenth preferred embodiment is different from the interposer substrate 10G according to the eighth preferred embodiment in that a concave portion 210I does not penetrate through a body 20I. Other configurations of the interposer substrate 10I are the same as or similar to the configurations of the interposer substrate 10G, and a description of the same or similar configurations will be omitted.

The concave portion 210I is open only to one lateral side of the body 20I.

An external connection conductor 31H is provided on a first principal surface 201I, an external connection conductor 32I is provided on a second principal surface 202I, and an external connection conductor 33I is provided on a third principal surface 203I. The external connection conductor 31I is connected to the external connection conductor 32I through a wiring conductor 340I in the body 20I. The wiring conductor 340I includes a via conductor 341I and a flat conductor pattern 342I. The external connection conductor 31I is connected to the external connection conductor 33I through a via conductor 351I in the body 20I.

Even in such a configuration, since the first principal surface 201I, the second principal surface 202I, and the third principal surface 203I overlap with one another in a plan view, the plane area of the body 20I is able to be reduced.

Figure 18:
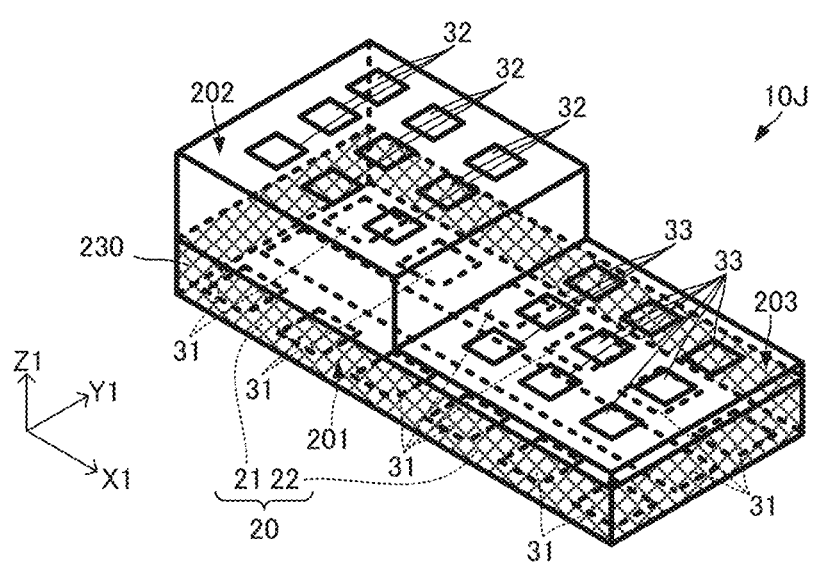
FIG. 18 is a perspective view showing a configuration of an interposer substrate according to an eleventh preferred embodiment of the present invention.

Subsequently, an interposer substrate according to an eleventh preferred embodiment of the present invention will be described with reference to the drawings. FIG. 18 is a perspective view showing a configuration of the interposer substrate according to the eleventh preferred embodiment of the present invention. FIG. 19 is a side view to illustrate an arrangement of a shield film.

As shown in FIG. 18, an interposer substrate 10J according to the eleventh preferred embodiment is different from the interposer substrate 10 according to the first preferred embodiment in that a shield film 230 is included. Other configurations of the interposer substrate 10J are the same as or similar to the configurations of the interposer substrate 10, and a description of the same or similar configurations will be omitted.

The shield film 230 is provided on a side surface of the body 20. In such a case, the shield film 230 is provided over an entire or substantially an entire periphery of the side surface of the body 20. The shield film 230 is provided at a predetermined height from an end portion on the side of the first principal surface 201 on the side surface of the body 20. The height, as shown in FIG. 19, for example, is preferably larger than the height of a surface mount electronic component 912 adjacent to the interposer substrate 10J when the surface mount electronic component 912 is mounted.

The shield film 230 is preferably made of a metal film, for example.

With such a configuration, propagation of noise to the surface mount electronic component adjacent to the interposer substrate 10J is able to be significantly reduced or prevented. In addition, conversely, leakage of noise from the surface mount electronic component to the interposer substrate 10J is able to be significantly reduced or prevented. As a result, a distance between the interposer substrate 10J and the surface mount electronic component is able to be reduced.

In addition, with this configuration, the shield film 230 is provided at a portion of the body 20, so that capacitive coupling with a wiring conductor inside the body 20 is able to be significantly reduced or prevented. Moreover, with this configuration, the shield film 230 is provided over the entire or substantially the entire periphery, so that wraparound of the magnetic flux is able to be significantly reduced or prevented, and characteristics as the interposer substrate 10J are improved.

It is to be noted that the shield film 230 may be provided as shown in FIGS. 20A to 20D.

FIGS. 20A to 20D are perspective views showing a configuration of another aspect of the interposer substrate according to the eleventh preferred embodiment of the present invention.

Figure 20A:
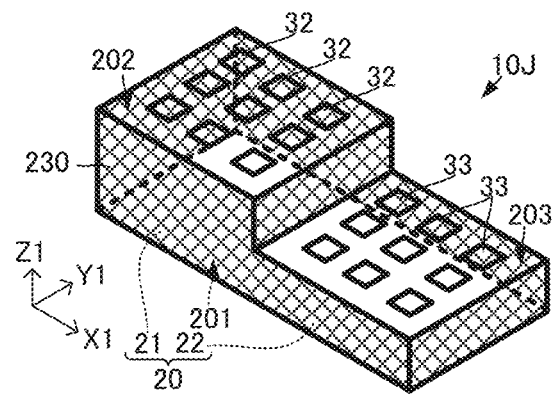
FIGS. 20A to 20D are perspective views showing a configuration of another aspect of the interposer substrate according to the eleventh preferred embodiment of the present invention.

In FIG. 20A, the shield film 230 is provided on the entire or substantially the entire side surfaces of the body 20. As a result, the shielding performance against noise is further improved.

Figure 20B:
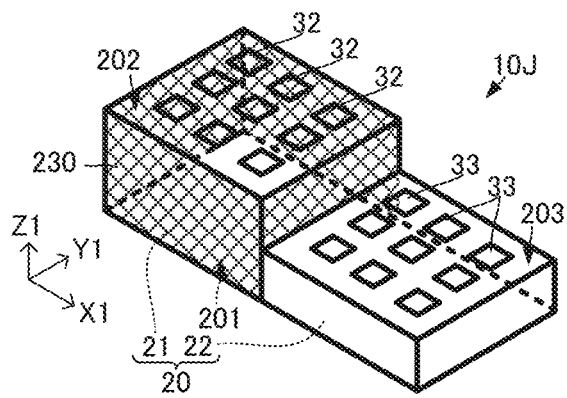
Figure 20C:
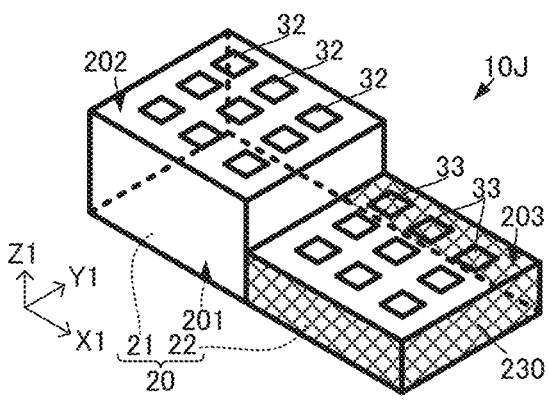
Figure 20D:
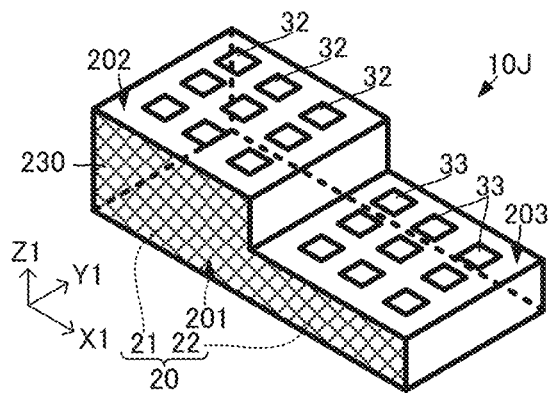

In FIG. 20B, the shield film 230 is provided only on the entirety or substantially the entirety of the side surface (a surface exposed to an external portion) of the first portion 21 of the body 20. In FIG. 20C, the shield film 230 is provided only on the entirety or substantially the entirety of the side surface (a surface exposed to an external portion) of the second portion 22 of the body 20. In FIG. 20D, the shield film 230 is provided only on one side surface of the body 20. Accordingly, the shield film 230 is able to be disposed only at a portion in which the shielding performance is needed.

Figure 21:
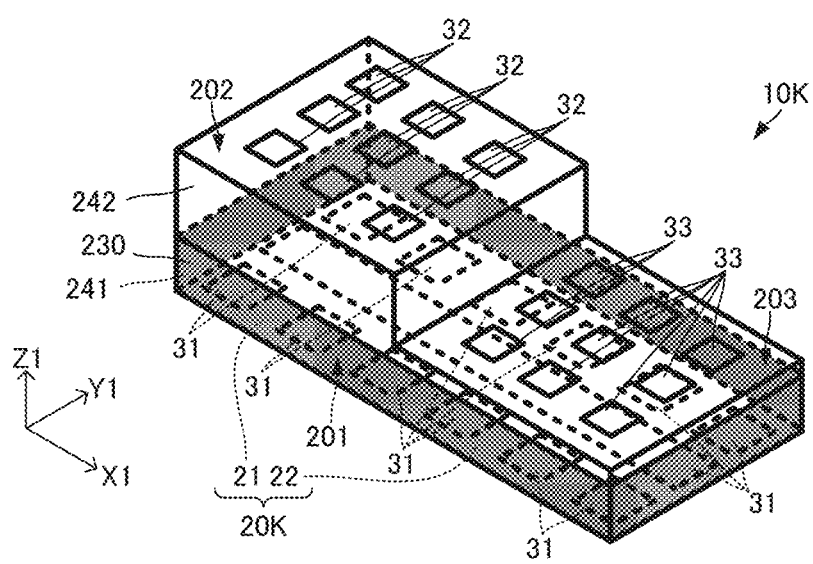
FIG. 21 is a perspective view showing a configuration of an interposer substrate according to a twelfth preferred embodiment of the present invention.

Subsequently, an interposer substrate according to a twelfth preferred embodiment of the present invention will be described with reference to the drawings. FIG. 21 is a perspective view showing a configuration of the interposer substrate according to the twelfth preferred embodiment of the present invention.

As shown in FIG. 21, an interposer substrate 10K according to the twelfth preferred embodiment is different from the interposer substrate 10J according to the eleventh preferred embodiment in that a portion covered with a shield film 230 in a body 20K is a magnetic layer 241. Other configurations of the interposer substrate 10K are the same as or similar to the configurations of the interposer substrate 10J, and a description of the same or similar configurations will be omitted.

The body 20K includes a magnetic layer 241 and a non-magnetic layer 242. The shield film 230 covers the magnetic layer 241.

With such a configuration, the magnetic layer 241 is able to provide the bead effect to a wiring conductor. In addition, the magnetic layer 241 is covered with the shield film 230, which further improves the confinement effect of the magnetic flux.

It is to be noted that, in each of the preferred embodiments described above, manufacturing is also able to be performed by the following non-limiting example of a manufacturing method. FIGS. 22A to 22D are side cross-sectional views showing a state in each step of one aspect of the method of manufacturing an interposer substrate. FIG. 23 is a flow chart showing the one aspect of the method of manufacturing an interposer substrate.

Figure 22A:
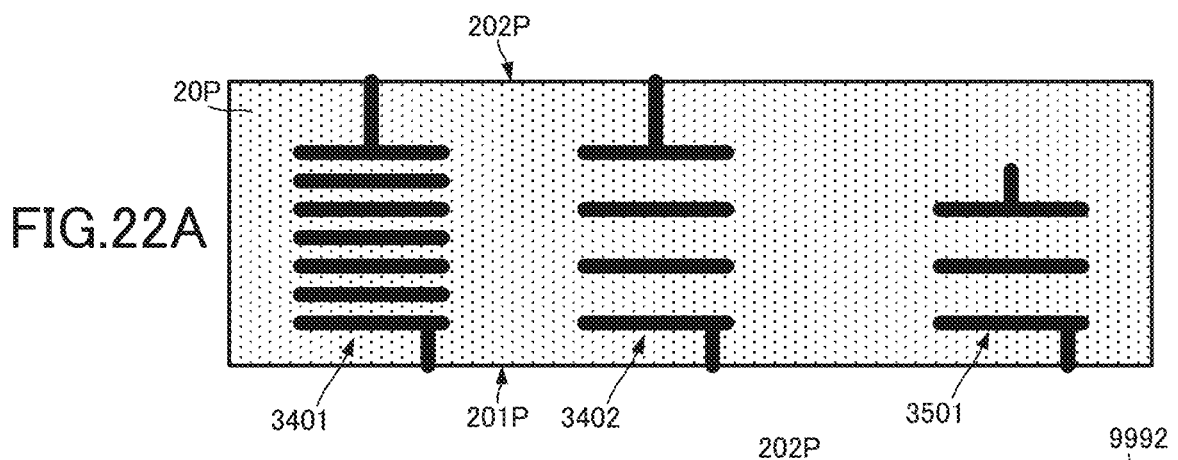
FIGS. 22A to 22D are side cross-sectional views showing a state in each step of one aspect of a method of manufacturing an interposer substrate according to a preferred embodiment of the present invention.
Figure 23:
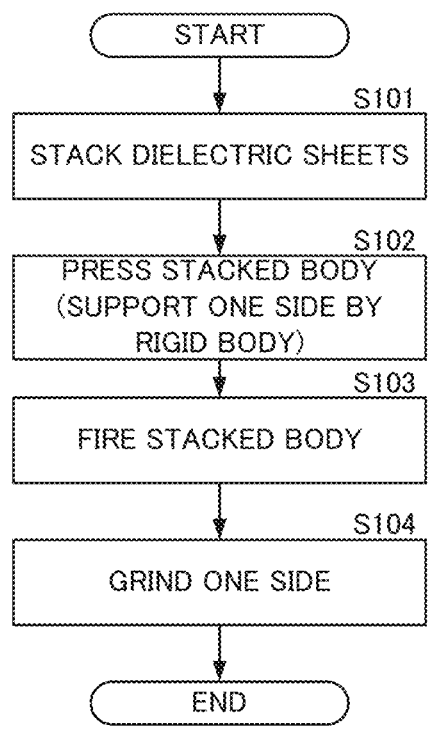
FIG. 23 is a flow chart showing the one aspect of a method of manufacturing an interposer substrate according to a preferred embodiment of the present invention.

First, as shown in FIG. 22A, a plurality of dielectric layers are laminated so as to respectively include wiring conductor patterns 3401, 3402, and 3501, and provide a stacked body 20P (FIG. 23: S101).

Figure 22B:
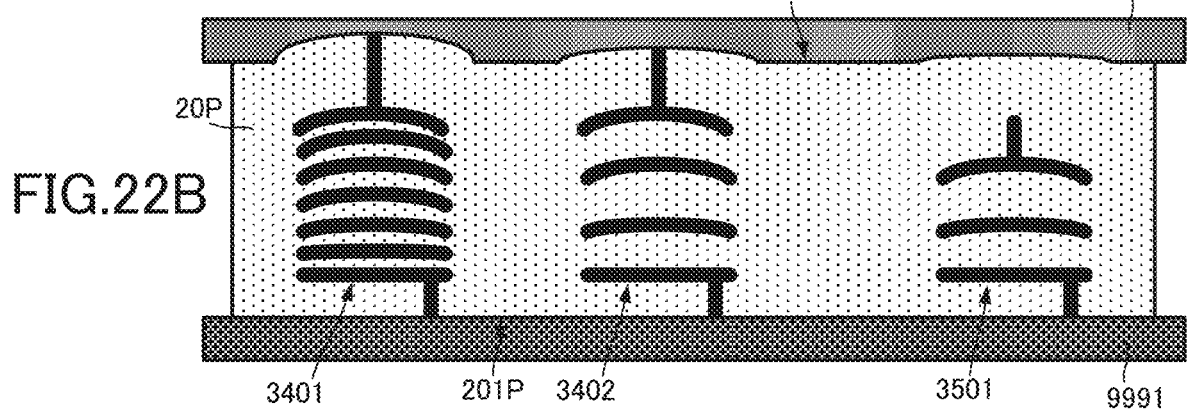

As shown in FIG. 22B, a flat plate 9991 is brought into contact with a first principal surface 201P of the stacked body 20P, a flat plate 9992 is brought into contact with a second principal surface 202P of the stacked body 20P, and a pressing process is performed (FIG. 23: S102). In such a case, the flat plate 9991 includes a rigid body that is not deformed by the pressing process, and the flat plate 9992 includes an elastic body that is deformed by the pressing process.

Accordingly, as shown in FIG. 22B, the second principal surface 202P of the stacked body 20P includes a portion that projects outward in a plan view, the portion being a region in which the wiring conductor patterns 3401, 3402, and 3501 are provided.

Figure 22C:
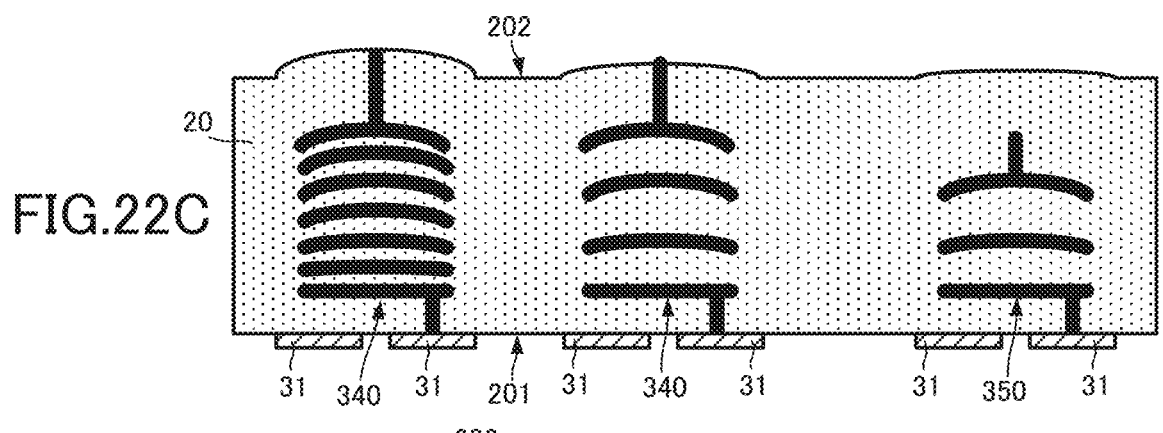

As shown in FIG. 22C, the stacked body 20P is fired so as to provide a body 20 (FIG. 23: S103). In such a case, a portion of the via conductor in the wiring conductor patterns 3401, 3402, and 3501 is solidified so as to provide wiring conductors 340 and 350. As described above, since the second principal surface 202P includes a projecting portion at the time of pressing, as shown in FIG. 22C, the second principal surface 202 of the body 20 after firing includes a portion that projects outward in a plan view, the portion being a region in which the wiring conductors 340 and 350 are provided.

After firing, as shown in FIG. 22C, an external connection conductor 31 is provided on the first principal surface 201 of the body 20.

Figure 22D:
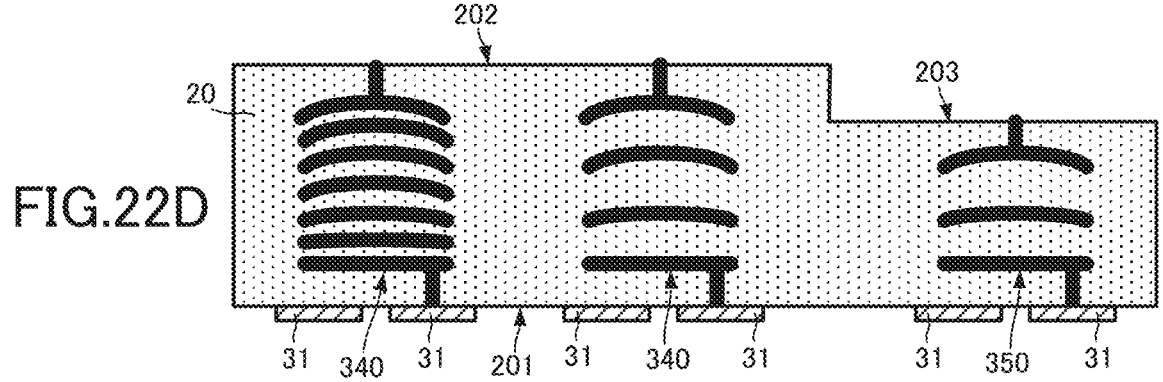

As shown in FIG. 22D, the second principal surface 202 of the body 20 is ground (FIG. 23: S104). In such a case, the depth to grind is varied, so that a second principal surface 202 and a third principal surface 203 that are different distances from the first principal surface 201 are provided. The grinding is able to finish the second principal surface 202 and the third principal surface 203 to flat surfaces.

In addition, since, by the grinding, the second principal surface 202 and the third principal surface 203 are provided, the wiring conductor 340 is able to be reliably exposed to the second principal surface 202, and the wiring conductor 350 is able to be reliably exposed to the third principal surface 203.

It is to be noted that step S103 and step S104 may be reversed.

Figure 24A:
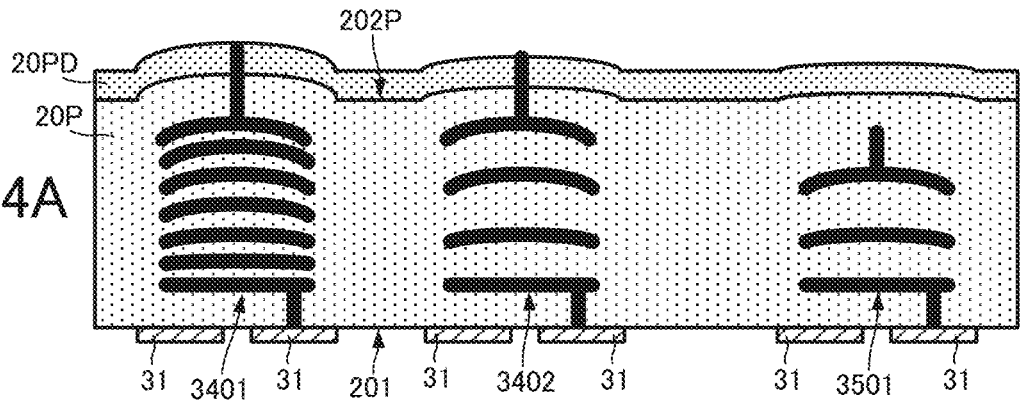
FIGS. 24A to 24C are side cross-sectional views showing a state in each step of one aspect of a method of manufacturing an interposer substrate according to a preferred embodiment of the present invention.
Figure 24B:
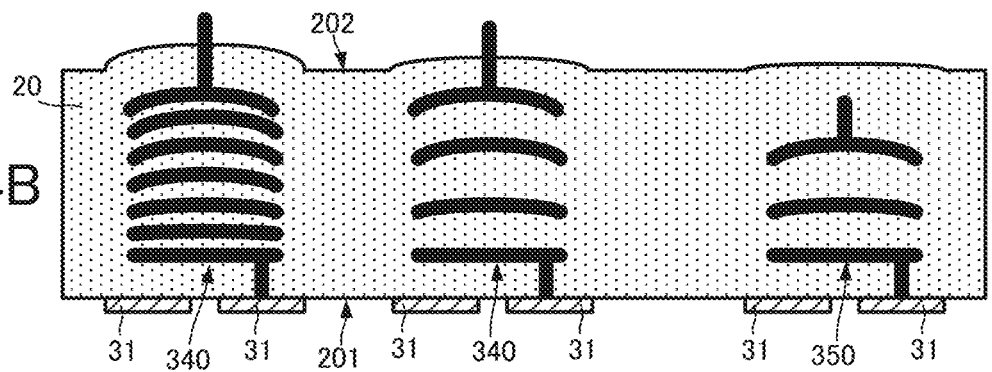
Figure 24C:
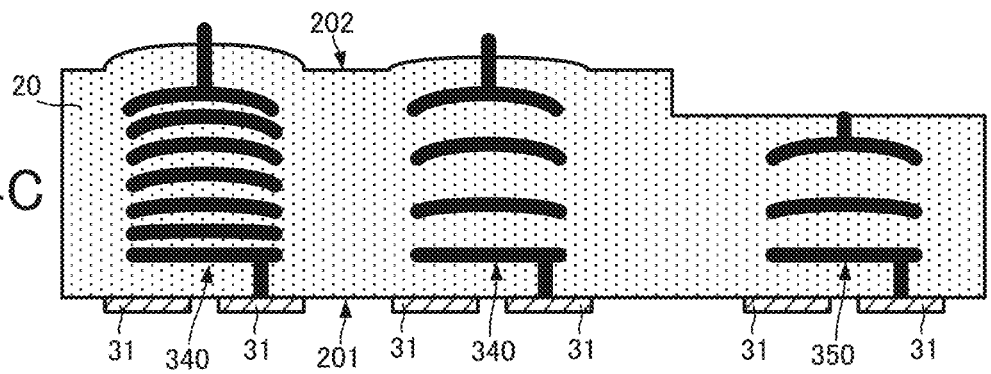
Figure 24D:
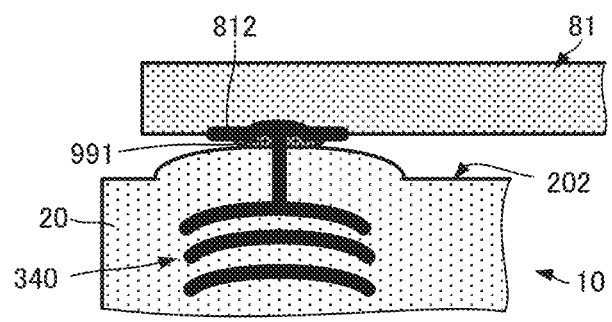
FIG. 24D is a partially enlarged side cross-sectional view showing a connection to a flat cable using the interposer substrate by this manufacturing method.

In addition, an interposer substrate may be manufactured by the following non-limiting example of a manufacturing method. FIGS. 24A to FIG. 24C are side cross-sectional views showing a state in each step of one aspect of a method of manufacturing an interposer substrate. FIG. 24D is a partially enlarged side cross-sectional view showing a connection to a flat cable using the interposer substrate by this manufacturing method.

As shown in FIG. 24A, when the stacked body 20P is provided, a sacrificial layer 20PD is provided on a surface layer on the side of the second principal surface 202P. The sacrificial layer 20PD is made of a material that is eliminated by firing.

With such a configuration, as shown in FIG. 24B, after firing, a wiring conductor 340 that projects to an external portion is further provided at a portion that projects outward at the second principal surface 202 of the body 20.

As shown in FIG. 24C, only a region (corresponding to the second portion 22) in which the wiring conductor 350 of the body 20 is provided is ground from the second principal surface 202.

In such a configuration, as shown in FIG. 24D, a projecting portion in the wiring conductor 340 is engaged into a terminal conductor 812 of the flat cable 81 and bonded together with the conductive bonding material 991. As a result, the bonding strength is improved.

In addition, although each of the above-described preferred embodiments does not describe a specific example in particular, it is not necessary to match the number of external connection conductors provided on the first principal surface, with the sum of the number of external connection conductors provided on the second principal surface and the number of external connection conductors provided on the third principal surface.

Moreover, although each of the above-described preferred embodiments does not describe a specific example in particular, each of the external connection conductors does not need to have the same shape. For example, the area of an external connection conductor for grounding may be large, and the area of another external connection conductor, such as an external connection conductor for signals and an external connection conductor for power source lines, may be smaller than the area of the external connection conductor for grounding.

Finally, the foregoing preferred embodiments are illustrative in all points and should not be construed to limit the scope of the present invention. The scope of the present invention is defined not by the foregoing preferred embodiment but by the following claims. Further, the scope of the present invention is intended to include all modifications within the scopes of the claims and within the meanings and scopes of equivalents.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
    an interposer substrate comprising:
        a body that includes a first principal surface, a second principal surface, and a third principal surface each of which is perpendicular to a height direction of the body, a distance between the first principal surface and the second principal surface being different from a distance between the first principal surface and the third principal surface in the height direction;
        a first external connection conductor that is provided on the first principal surface;
        a second external connection conductor that is provided on the second principal surface;
        a third external connection conductor that is provided on the third principal surface; and
        a wiring conductor that is provided inside the body and connects the first external connection conductor, and the second external connection conductor and the third external connection conductor, and includes a flat conductor pattern that is inside the body and has a flat plane perpendicular or substantially perpendicular to the height direction of the body, and a via conductor that is inside the body and extends in the height direction;
    a first circuit board that is bonded to the first external connection conductor such that the interposer substrate is mounted to the first circuit board;
    a first flat cable, including terminal conductors on a first end and a second end, the terminal conductor on the first end of the first flat cable is bonded to the second external connection conductor;
    a second flat cable, including terminal conductors on a first end and a second end, the terminal conductor on the first end of the second flat cable is bonded to the third external connection conductor;
    a second circuit board, bonded to the terminal conductors on the second end of the first flat cable; and
    a third circuit board, bonded to the terminal conductors on the second end of the second flat cable; wherein the first external connection conductor is connected to the second external connection conductor through the flat conductor pattern and the via conductor inside the body, and the first external connection conductor is connected to the third external connection conductor through the flat conductor pattern and the via conductor inside the body;

the circuit module is defined by a multilayer substrate structure that includes the interposer substrate and the first circuit board; and each of the first flat cable and the second flat cable extends in a different direction.

2. The circuit module according to claim 1, wherein, in a plan view, the first flat cable and the second flat cable at least partially overlap with each other.

3. The circuit module according to claim 1, wherein
the distance between the first principal surface and the second principal surface is larger than the distance between the first principal surface and the third principal surface; and the distance between the first principal surface and the third principal surface is larger than a height of a surface mount electronic component that is mounted on the first circuit board and is adjacent to the interposer substrate.

4. The circuit module according to claim 1, wherein the third principal surface, in a plan view in the height direction of the body, at least partially overlaps with the second principal surface.

5. The circuit module according to claim 4, wherein
the body includes a concave portion; and
the third principal surface is defined by a wall of the concave portion that is concave from a lateral side of the body.

* * * * *